(12) United States Patent
Iwase et al.

(10) Patent No.: US 10,356,896 B2
(45) Date of Patent: Jul. 16, 2019

(54) SELF-REPAIRING WIRING

(71) Applicant: WASEDA UNIVERSITY, Tokyo (JP)

(72) Inventors: Eiji Iwase, Tokyo (JP); Tomoya Koshi, Tokyo (JP)

(73) Assignee: WASEDA UNIVERSITY, Tokyo (JP)

( * ) Notice: Subject to any disclaimer, the term of this patent is extended or adjusted under 35 U.S.C. 154(b) by 0 days.

(21) Appl. No.: 15/241,871

(22) Filed: Aug. 19, 2016

(65) Prior Publication Data

US 2016/0360612 A1 Dec. 8, 2016

Related U.S. Application Data

(63) Continuation of application No. PCT/JP2015/054888, filed on Feb. 20, 2015.

(30) Foreign Application Priority Data

Feb. 21, 2014 (JP) .................................. 2014-032182

(51) Int. Cl.
*H05K 1/02* (2006.01)
*H05K 1/18* (2006.01)
(Continued)

(52) U.S. Cl.
CPC ........... *H05K 1/0283* (2013.01); *H05K 1/092* (2013.01); *H05K 1/181* (2013.01); *H05K 3/225* (2013.01);
(Continued)

(58) Field of Classification Search
CPC ...... H05K 1/0283; H05K 1/181; H05K 1/092; H05K 3/225; H05K 2203/105; H05K 2203/0723; H05K 2203/173
See application file for complete search history.

(56) References Cited

U.S. PATENT DOCUMENTS 4,630,355 A * 12/1986 Johnson .............. H01L 23/5382
148/DIG. 55
4,919,971 A * 4/1990 Chen ..................... H05K 3/225
205/102

(Continued)

FOREIGN PATENT DOCUMENTS

JP 2-116194 A 4/1990
JP 8-298364 A 11/1996
(Continued)

OTHER PUBLICATIONS

Hammock et al., "25th Anniversary Article: The Evolution of Electronic Skin(E-Skin): A Brief History, Design Considerations, and Recent Progress", Advanced Materials, vol. 25, 2013, pp. 5997-6038, (42 pages).

(Continued)

*Primary Examiner* — Ishwarbhai B Patel
(74) *Attorney, Agent, or Firm* — Westerman, Hattori, Daniels & Adrian, LLP

(57) ABSTRACT

A self-healing wire includes, an electric wire arranged on a substrate, and a hybrid structure in which the electric wire is covered with at least one fluid selected from the group consisting of a fluid having conductive particles dispersed therein and a fluid having metal ions dissolved therein, formed on a healing portion for a crack to be generated in the electric wire. And a stretchable device includes the self-healing wire formed on a stretchable base material and an electric element mounted only on a base material higher in rigidity than the stretchable base material. Even when a crack is generated in the electric wire due to stretching of the substrate having flexibility, the crack is bridged by the conductive particles or a solid metal deposited from the metal ions in the fluid. Thus the self-healing wire and the (Continued)

stretchable device having both high conductivity and high stretchability are provided.

19 Claims, 13 Drawing Sheets

(51) Int. Cl.
*H05K 1/11* (2006.01)
*H05K 3/22* (2006.01)
*H05K 1/09* (2006.01)
*H05K 1/03* (2006.01)

(52) U.S. Cl.
CPC .............. *H05K 1/0277* (2013.01); *H05K 1/03* (2013.01); *H05K 1/11* (2013.01); *H05K 1/118* (2013.01); *H05K 1/18* (2013.01); *H05K 1/189* (2013.01); *H05K 2203/0723* (2013.01); *H05K 2203/105* (2013.01); *H05K 2203/173* (2013.01)

(56) References Cited

U.S. PATENT DOCUMENTS

| | | | |
|---|---|---|---|
| 4,994,154 A * | 2/1991 | Chen | C23C 18/31 205/103 |
| 5,141,602 A * | 8/1992 | Chen | H01L 21/485 204/229.5 |
| 5,717,556 A | 2/1998 | Yanagida | |
| 2007/0241856 A1 | 10/2007 | Ohtsuka et al. | |
| 2015/0065840 A1 * | 3/2015 | Bailey | A61B 5/6802 600/384 |
| 2016/0028153 A1 * | 1/2016 | Li | H01Q 9/0407 343/718 |
| 2016/0037623 A1 * | 2/2016 | Fjelstad | H05K 1/0203 361/720 |

FOREIGN PATENT DOCUMENTS

| | | |
|---|---|---|
| JP | 3955956 B2 | 8/2007 |
| JP | 2010-27660 A | 2/2010 |

OTHER PUBLICATIONS

Sekitani et al., "Stretchable active matrix organic light-emitting diode display using printable elastic conductors", Nature Materials, vol. 8, Jun. 2009, pp. 494-499, (6 pages).
Gray et al., "High-Conductivity Elastomeric Electronics", Advanced Materials, No. 5, Mar. 5, 2004, pp. 393-397, (5 pages).
Kim et al., "Epidermal Electronics", Science, vol. 333, 2011, pp. 838-843, (8 pages).
Siegel et al., "Microsolidics: Fabrication of Three-Dimensional Metallic Microstructures in Poly(Dimethylsiloxane)", Advanced Materials, vol. 19, 2007, pp. 727-733, (7 pages).
International Search Report dated May 12, 2015, issued in counterpart International Application No. PCT/JP2015/054888 (1 page).

* cited by examiner

FIG.23
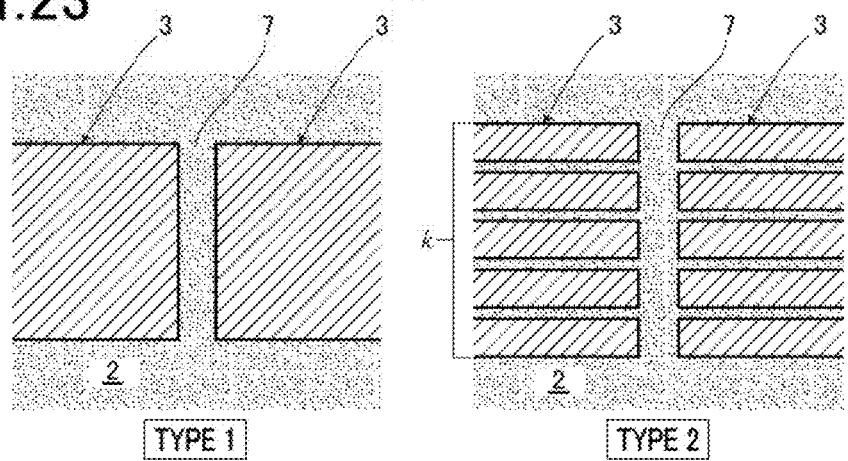
FIG.24A   MANUFACTURE OF SUBSTRATE
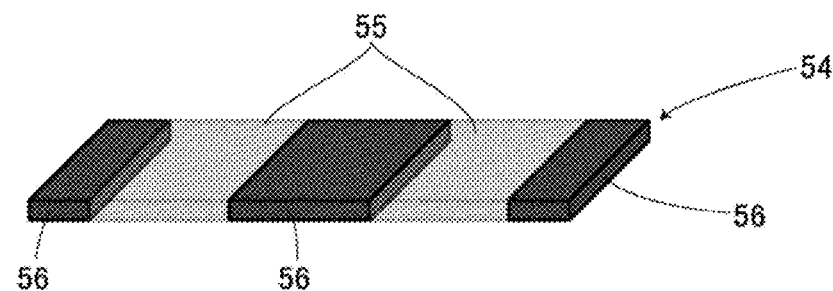
FIG.24B   PATTERNING OF WIRE LAYER
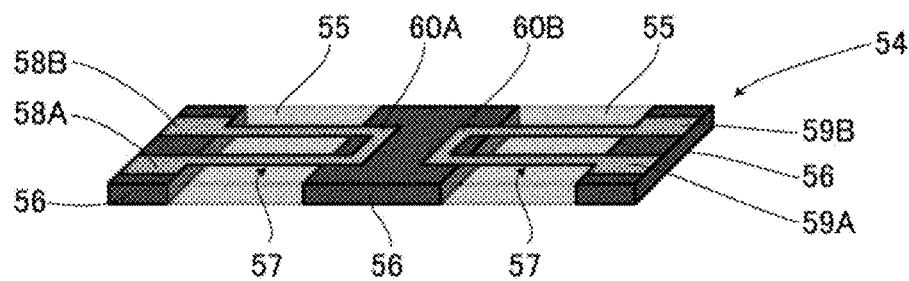
FIG.24C   MOUNTING OF ELECTRIC ELEMENT
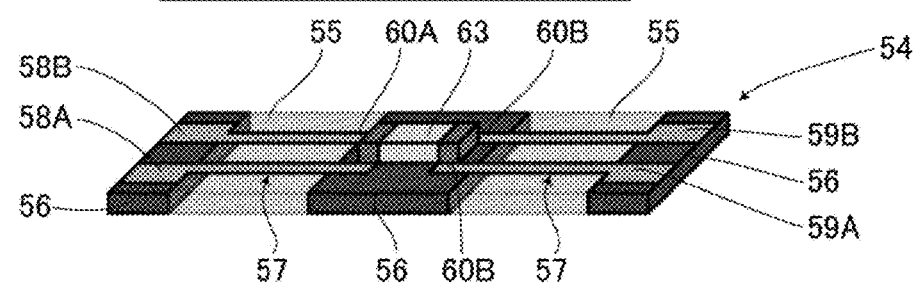

FIG. 24D  MANUFACTURE OF FLOW PATH PATTERN AND SEALING
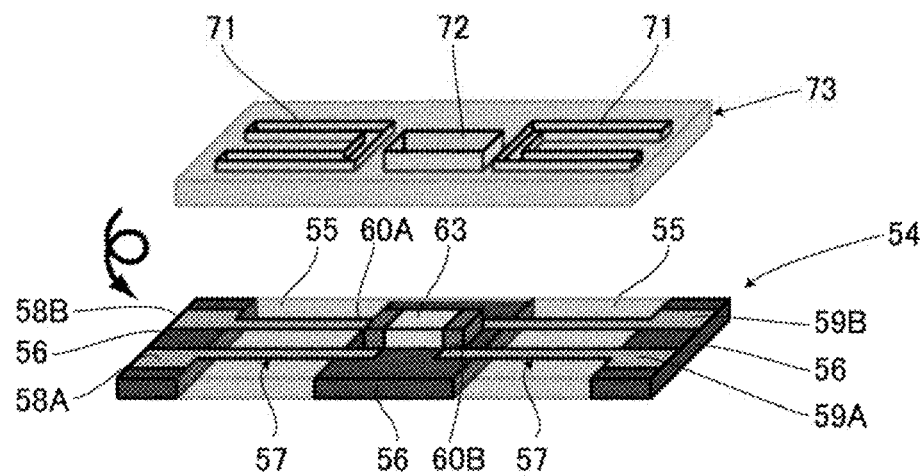
FIG. 24E  COMPLETE STATE AND ITS SECTIONAL VIEW
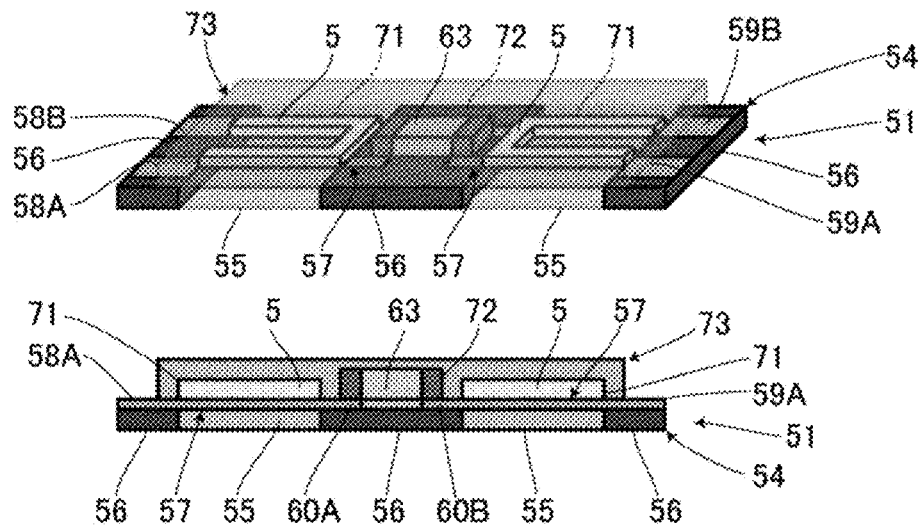

SELF-REPAIRING WIRING

CROSS-REFERENCE TO RELATED APPLICATIONS

This application is a continuation application of International Application PCT/JP2015/054888 filed on Feb. 20, 2015 and designated the U.S., which claims the benefit of priority of the prior Japanese Patent Application No. 2014-032182, filed on Feb. 21, 2014, the entire contents of which are incorporated herein by reference.

FIELD

The embodiments discussed herein are related to a self-healing wire (self-repairing wiring) configured to achieve an electric wire having in combination high resistance to stretching, high conductivity, and a self-healing function, and to a stretchable device including the self-healing wire.

BACKGROUND

In recent years, studies on flexible devices having flexibility and stretchability have been actively conducted (ex. Mallory L. Hammock et al., "25th Anniversary Article: The Evolution of ElectronicSkin (E-Skin): A Brief History, Design Considerations, and Recent Progress," Advanced Materials, vol. 25, pp. 5997-6038, 2013). Further, as wires to be used in the flexible devices, there are known wires made of conductive elastomer materials, and metal wires having curved shapes (ex. Tsuyoshi Sekitani et al., "Stretchable active-matrix organic light-emitting diode display using printable elastic conductors," Nature Materials, vol. 8, pp. 494-499, 2009, and Darren S. Gray et al., "High-Conductivity Elastomeric Electronics," Advanced Materials, No. 5, pp. 393-397, 2004). However, there are problems in that the conductive elastomer has low conductivity, and the curved metal wires may be cracked by stretching.

Specifically, as a stretchable wire that has been studied so far, conductive rubber obtained by mixing a conductive material into a rubber material or a gel material is most popular, but its electric conductivity is about $10^1$ S/m. Further, even a gel material reported in the Sekitani et al., which is said to have significantly higher conductivity than that of the related art, has a resistance to stretching of 29% and conductivity of only $1.02 \times 10^4$ S/m. Those values of conductivity are significantly lower than that of gold (Au) used as a solid wire material, which is $4.6 \times 10^7$ S/m.

Meanwhile, as a stretchable wire using metal, a metal wire is formed into a zig-zag shape, to thereby achieve a device that does not disconnect even when stretching occurs to some extent (ex. Dae-Hyeong Kim et al., "Epidermal Electronics," Science, vol. 333, pp. 838-843, 2011). However, metal is only used, and hence not only the stretchability is limited, but also there is a fear of fatigue failure due to repeated stretching. Usage of metal is preferred as the stretchable wire in consideration of high conductivity, but, so far, there are no reports that have used metal and achieved high resistance to stretching (that is, no disconnection due to stretching or no fatigue failure due to repeated stretching).

Further, as a study example of a self-healing wire when a crack is generated in a metal wire, there has been reported a study involving forming a wire by injecting solder into a flow channel of silicone rubber, and, when the wire is disconnected by deformation, applying heat to heal the disconnection (ex. A. C. Siegel et al., "Microsolidics: Fabrication of Three-Dimensional Metallic Microstructures in Poly(Dimethylsiloxane)," Advanced Materials, vol. 19, pp. 727-733, 2007). However, a combination of solid solder and a metal wire, which is a solid as well, requires heating up to a temperature capable of melting the solder, for example, every time the crack is healed. Thus, fundamental structural improvements of a crack healing portion have been demanded.

SUMMARY

According to one aspect of the present invention, there is provided a self-healing wire includes, an electric wire arranged on a substrate, and a hybrid structure in which the electric wire is covered with at least one fluid selected from the group consisting of a fluid having conductive particles dispersed therein and a fluid having metal ions dissolved therein, formed on a healing portion for a crack to be generated in the electric wire.

According to another aspect of the present invention, there is provided a stretchable device includes, a substrate having a first portion made of a stretchable material and a second portion made of a material higher in rigidity than the stretchable material, an electric wire, arranged on the first portion of the substrate, a hybrid structure in which the electric wire is covered with at least one fluid selected from the group consisting of a fluid having conductive particles dispersed therein and a fluid having metal ions dissolved therein, formed on a healing portion for a crack to be generated in the electric wire, and an electric element mounted only on the second portion of the substrate.

BRIEF DESCRIPTION OF DRAWINGS

FIG. 23 is a lateral sectional view for illustrating structure of a self-healing wire around a crack according to a sixth embodiment.

FIG. 24A is a perspective view for illustrating an example of a method of manufacturing a stretchable device according to a seventh embodiment.

FIG. 24B is a perspective view for illustrating the example of the method of manufacturing a stretchable device, according to the seventh embodiment.

FIG. 24C is a perspective view for illustrating the example of the method of manufacturing a stretchable device, according to the seventh embodiment.

FIG. 24D is a perspective view for illustrating the example of the method of manufacturing a stretchable device, according to the seventh embodiment.

FIG. 24E is a perspective view and a vertical sectional view for illustrating the example of the method of manufacturing a stretchable device, according to the seventh embodiment.

DESCRIPTION OF EMBODIMENTS

Now, some embodiments of the present invention are described with reference to the accompanying drawings. In the respective embodiments, same or similar configurations are denoted by same reference symbols, and description of same or similar parts is omitted to avoid redundant description.

Figure 1:
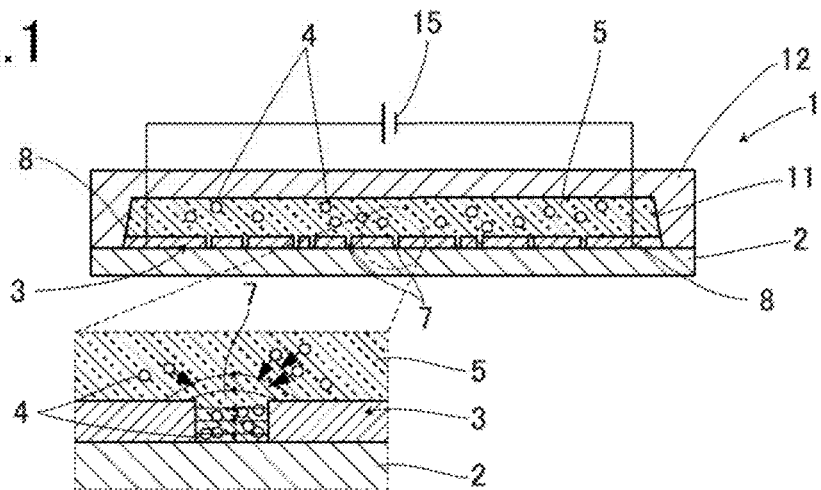
FIG. 1 is a vertical sectional view for illustrating basic structure of a self-healing wire according to a first embodiment.

FIG. 1 is an illustration of basic structure of a self-healing wire 1 according to a first embodiment of the present invention. The self-healing wire 1 has basic structure in which a metal wire 3 is arranged on a sheet-like flexible substrate 2, and a liquid 5 containing metal nanoparticles 4 is provided so as to cover the metal wire 3. Further, in this case, a container 12 having a recessed liquid sealing portion 11 formed therein is bonded to the upper surface of the flexible substrate 2 such that the liquid 5 received in the liquid sealing portion 11 is sealed between the flexible substrate 2 and the container 12. At both ends of the metal wire 3, terminal portions 8 are formed so as to apply a voltage to the metal wire 3 from a power supply 15 provided outside of the self-healing wire 1.

The flexible substrate 2 and the container 12, which serve as an outer shell member of the self-healing wire 1, are made of an insulating material having flexibility and stretchability. In contrast, the metal wire 3 is made of a conductive material that has lower flexibility and stretchability than those of the outer shell member of the self-healing wire 1. When the self-healing wire 1 is forcedly bent or stretched, the metal wire 3 is disconnected, and thus cracks 7 as illustrated in FIG. 1 are partially formed.

In this embodiment, it should be noted that hybrid structure including the liquid 5 and the solid metal wire 3 is employed as a healing portion for the crack 7 generated in the metal wire 3. Such hybrid structure is used in common in all of the embodiments described below. Particularly in the healing portion for the crack 7 of this embodiment, the metal wire 3 is covered with the liquid 5 having the metal nanoparticles 4 dispersed therein, and the metal wire 3 includes the terminal portions 8 configured to enable voltage application to the metal wire 3, to thereby generate an electric field only in the crack 7.

Figure 2:
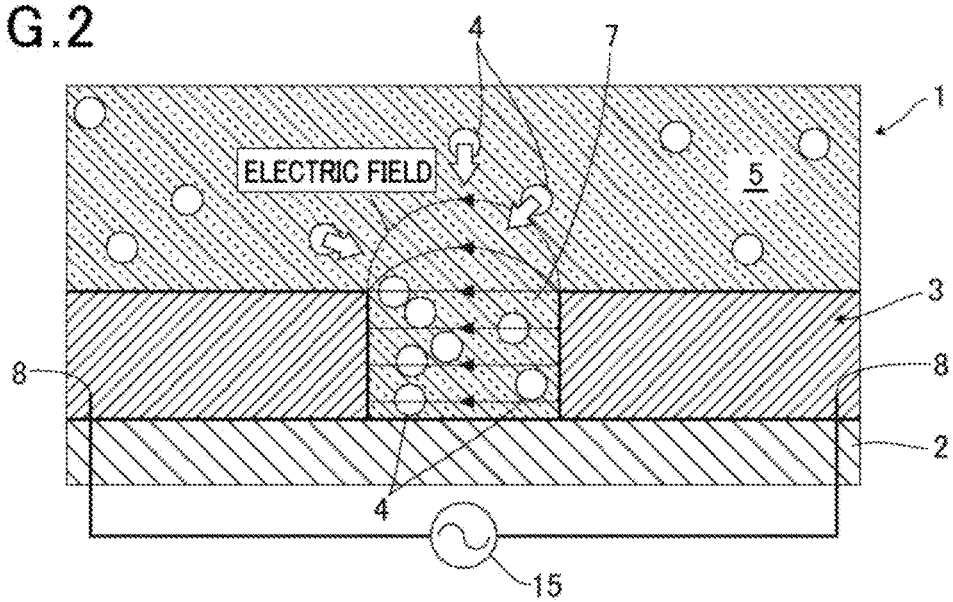
FIG. 2 is a schematic view for illustrating a healing state by electric field trapping of metal nanoparticles, according to the first embodiment.

FIG. 2 is a schematic view for illustrating a healing state by electric field trapping of the metal nanoparticles 4 in the above-mentioned self-healing wire 1.

In this embodiment, the electric field trapping phenomenon of the metal nanoparticles 4 is used so that the metal wire 3 formed on the stretchable flexible substrate 2 can have a self-healing function. The electric field trapping phenomenon occurs in a region in which a non-uniform electric field is caused, and hence only a part with the crack 7 can be selectively healed. The trapped metal nanoparticles 4 bridge the crack 7 to heal the metal wire 3, and thus the metal wire 3 with high conductivity can be obtained again.

In this case, considering a force that acts on the metal nanoparticle 4 when a voltage is applied to the metal wire 3 with the crack 7, a total force $F_{Total}$ can be represented as Formula 1.

$$F_{Total}=F_{VDW}+F_{ES}+F_{EP}+F_{DEP} \qquad \text{[Formula 1]}$$

In Formula 1, $F_{VDW}$ is a van der Waals' force, $F_{ES}$ is an electrostatic repulsive force, $F_{EP}$ is an electrophoretic force, and $F_{DEP}$ is a dielectrophoretic force. Of those, the van der Waals' force $F_{VDW}$ and the electrostatic repulsive force $F_{ES}$ are determined depending on particles (metal nanoparticles 4) and a solvent (liquid 5), and are forces that are independent of the application voltage of the power supply 15. Further, when the application voltage of the power supply 15 is DC or has low frequency, both of the electrophoretic force $F_{EP}$ and the dielectrophoretic force $F_{DEP}$ act, but when the application voltage has high frequency, only the dielectrophoretic force $F_{DEP}$ acts. This dielectrophoretic force $F_{DEP}$ is a force that causes the electric field trapping phenomenon of the metal nanoparticles 4. When a high-frequency AC voltage is applied to the metal wire 3, the metal wire 3 can be healed by the electric field trapping phenomenon.

A time average $<F_{DEP}>$ of the dielectrophoretic force $F_{DEP}$ can be represented by Formula 2.

$$\langle F_{DEP} \rangle 2\pi\varepsilon_1 R^3 Re[\underline{K}(\omega)] \nabla E_{rms}^2 \quad \text{[Formula 2]}$$

In this case, $\varepsilon_1$ is a permittivity of a solution, R is a radius of a particle, $\omega$ is an angular frequency of an application voltage, and $E_{rms}$ is an effective value of an electric field intensity. Further, $Re[K\_(\omega)]$ (in the following, in parts other than the expressions, the underline "_" drawn below the letter is written after the corresponding letter) is a value of a so-called Clausius-Mosotti factor, which indicates polarizability of a particle. The direction of the dielectrophoretic force $F_{DEP}$ is determined based on the sign of $Re[K\_(\omega)]$ (real part of $K\_(\omega)$). $K\_(\omega)$ can be represented by Formula 3.

$$K(\omega) = \frac{\varepsilon_2 - \varepsilon_1 - j(\sigma_2 - \sigma_1)/\omega}{\varepsilon_2 + 2\varepsilon_1 - j(\sigma_2 + 2\sigma_1)/\omega} \quad \text{[Formula 3]}$$

In this case, $\varepsilon_2$ is a permittivity of a particle, $\sigma_1$ is electric conductivity of a solution, $\sigma_2$ is electric conductivity of a particle, and j is an imaginary unit. As an example, when gold nanoparticles corresponding to the metal nanoparticles 4 are dispersed in water, $Re[K\_(\omega)]>0$ is obtained with an AC voltage of $10^{16}$ Hz or less, and the gold nanoparticles are attracted to the crack 7 by the dielectrophoretic force $F_{DEP}$. Therefore, when water having gold nanoparticles dispersed therein is used as the liquid 5, in order to cause electric field trapping of the gold nanoparticles, the frequency of the AC voltage applied to the metal wire 3 is preferred to be $10^{16}$ Hz or less.

Figure 3A:
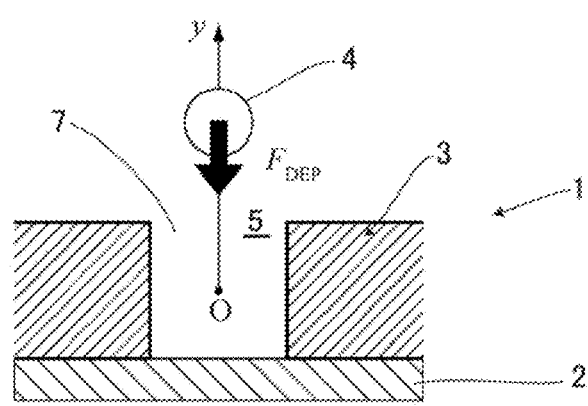
FIG. 3A is a diagram for schematically illustrating a force that a metal nanoparticle separated from a point O receives from an electric field, according to the first embodiment.
Figure 3B:
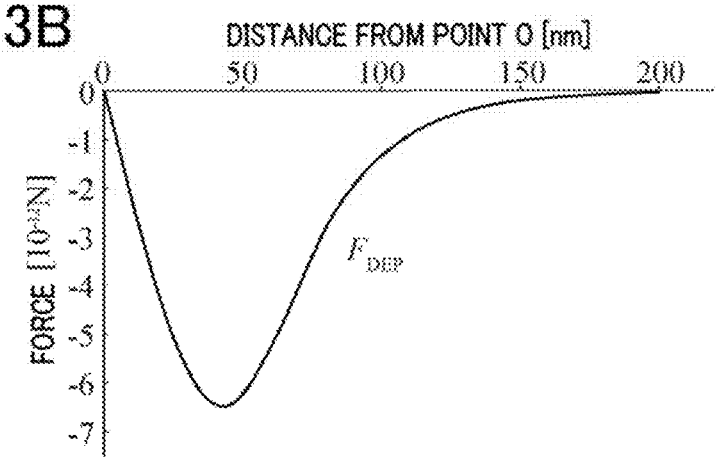
FIG. 3B is a graph for showing theoretical analysis of a relationship between a distance from the point O and a dielectrophoretic force, according to the first embodiment.

FIG. 3A is a diagram for schematically illustrating the dielectrophoretic force $F_{DEP}$ that the metal nanoparticle 4 separated from a point O receives from an electric field, and FIG. 3B is a graph for theoretically showing a relationship between the dielectrophoretic force $F_{DEP}$ and a distance from the point O inside the crack 7 to the metal nanoparticle 4.

As represented by Formula 2 and Formula 3, the dielectrophoretic force $F_{DEP}$ can be calculated based on the particle diameter of the metal nanoparticles 4, the intensity distribution of the electric field, the permittivity and the electric conductivity of the metal nanoparticles 4, and the permittivity and the electric conductivity of the liquid 5. When a theoretical analysis is performed by assigning parameters of materials and changing parameters of dimensions and electric fields, the graph of FIG. 3B can be obtained. In this case, considering the availability of the metal nanoparticles 4 and whether the metal wire 3 can be formed, the materials and dimensions of the respective portions were determined. Specifically, there were used, as the liquid 5 containing the metal nanoparticles 4, an aqueous solution having dispersed therein gold nanoparticles having an average diameter of 40 nm, which was produced by Sigma-Aldrich Co. LLC., and as the metal wire 3, a gold wire having a thickness of 100 nm. Further, as the application voltage to the gold wire, an AC voltage of 100 kHz was used.

Figure 4A:
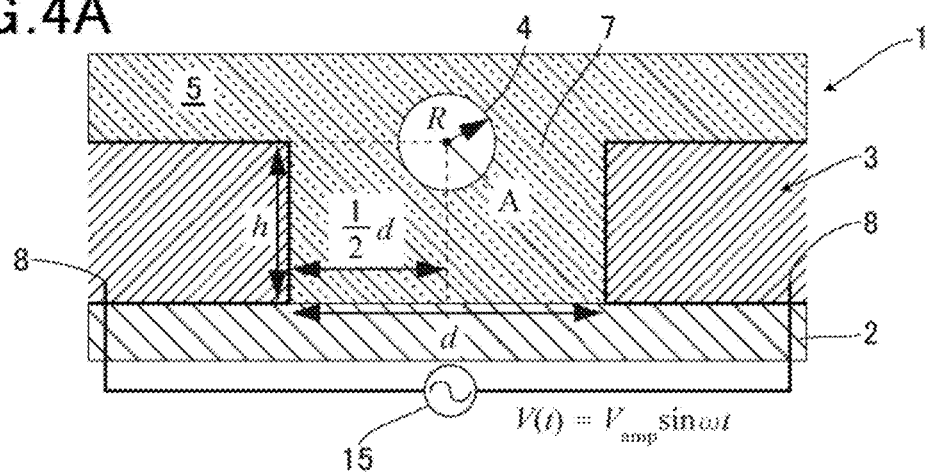
FIG. 4A is a diagram for schematically illustrating a force that a metal nanoparticle positioned at a point A receives from an electric field, according to the first embodiment.
Figure 4B:
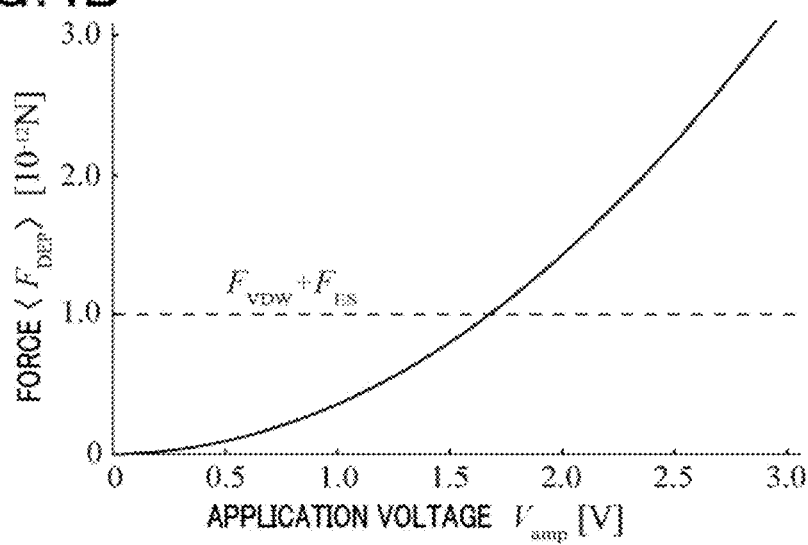
FIG. 4B is a graph for showing a calculation result of the dielectrophoretic force with respect to an application voltage, according to the first embodiment.

FIG. 4A is a diagram for schematically illustrating the dielectrophoretic force $F_{DEP}$ that the metal nanoparticle 4 positioned at a point A receives from an electric field. FIG. 4B is a graph for showing a calculation result of the dielectrophoretic force $F_{DEP}$ with respect to the application voltage to the metal wire 3.

In this calculation as well, there were used, as the liquid 5 containing the metal nanoparticles 4, an aqueous solution having dispersed therein gold nanoparticles having a radius of R=20 nm, and an AC voltage $V(t)=V_{amp} \sin \omega t$ of 100 kHz supplied from the power supply 15. Further, the thickness of the gold wire was set to h=100 nm, and the width of the crack 7 was set to d=200 nm, to thereby calculate the dielectrophoretic force $F_{DEP}$ based on Formula 2. FIG. 4B is a graph for showing the magnitude of the time average $<F_{DEP}>$ of the dielectrophoretic force $F_{DEP}$ at the point A of FIG. 4A when the amplitude $V_{amp}$ of the application voltage to the gold wire is changed from 0 V to 3 V. The magnitude of a force obtained by adding the electrostatic repulsive force $F_{ES}$ to the van der Waals' force $F_{VDW}$ ($F_{VDW}+F_{ES}$) is about $10^{-12}$ N. Therefore, it can be predicted that the electric field trapping of the gold nanoparticles occurs at the voltage amplitude $V_{amp}$ of about 1.70 V or more at which the time average $<F_{DEP}>$ of the dielectrophoretic force $F_{DP}$ becomes larger than $10^{-12}$ N.

Next, an experiment example of this embodiment is described with reference to FIG. 5 to FIG. 15. In this case, it was verified that the gold wire was able to be healed by the electric field trapping of the gold nanoparticles.

Figure 5:
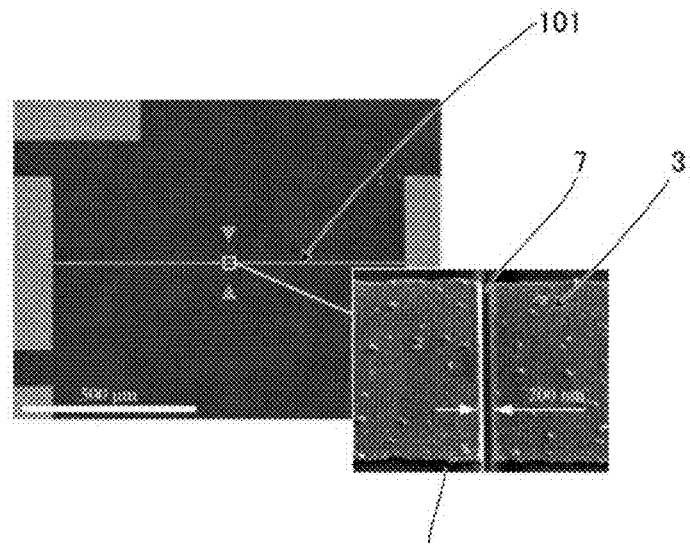
FIG. 5 is a photograph for showing a configuration of an experiment wire, according to the first embodiment.

First, an experiment wire 101 and a glass substrate 102 were used instead of the self-healing wire 1 and the flexible substrate 2 illustrated in FIG. 1, and there was performed a healing experiment of a crack 7, which was artificially formed on the glass substrate 102. FIG. 5 is a photograph for showing the experiment wire 101 in which a crack 7 having a width of 200 nm was formed in a gold wire corresponding to the metal wire 3 formed on the glass substrate 102. In the experiment, it was verified that the wire was healed as theoretically predicted by the electric field trapping of the gold nanoparticles. Further, the maximum width that the crack 7 can be healed was verified.

In the experiment, on the glass substrate 102, a gold wire having a width of 10 µm, a thickness of 100 nm, and a length of 1 mm was formed by photolithography. Then, there was artificially formed, by focused ion beam (FIB) processing, a crack 7 corresponding to a disconnected region crossing the metal wire 3 to have a width ranging from 200 nm to 1,600 nm. As the aqueous solution having the gold nanoparticles dispersed therein, there was used 741981 produced by Sigma-Aldrich Co. LLC, having a particle concentration of $7.15 \times 10^{10}$ particles/ml and a radius of 20 nm. Then, an AC voltage of 100 KHZ was applied by an LCR meter corresponding to the power supply 15, and simultaneously impedance (AC resistance value) |Z| was measured by a four-terminal method.

Figure 6:
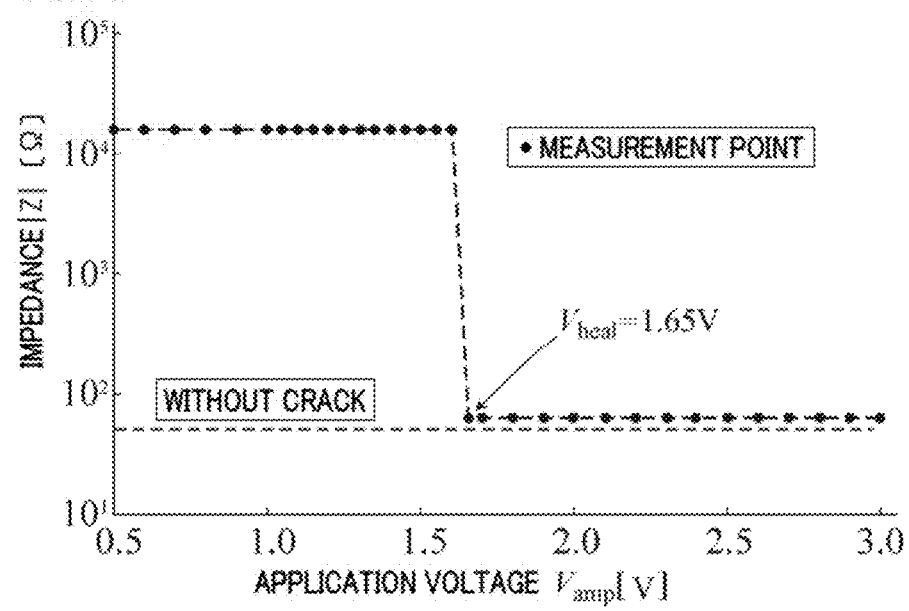
FIG. 6 is a graph for showing a relationship between amplitude of the application voltage and impedance of a metal wire as an experiment example using a glass substrate, according to the first embodiment.
Figure 7:
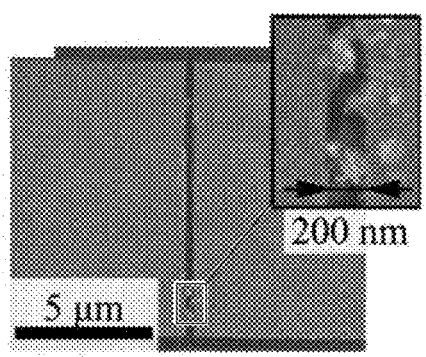
FIG. 7 is a photograph of a metal wire obtained after an experiment when a crack width is 200 nm, according to the first embodiment.

FIG. 6 is a measurement result of how the impedance |Z| of the metal wire 3 changes when the voltage amplitude $V_{amp}$ is increased from 0.50 V to 3.00 V in the crack 7 having a width of 200 nm. In FIG. 6, when the voltage amplitude $V_{amp}$ is 1.65 V, the impedance |Z| is dropped sharply from the order of $10^4 \Omega$ to the order of $10^1 \Omega$. After that, even when the application voltage to the metal wire 3 is increased, the impedance |Z| is not changed. This state is considered to be caused because the gold nanoparticles aggregated by the electric field trapping have bridged the crack 7 to heal the metal wire 3. Therefore, this voltage is referred to as "healing voltage $V_{heal}$". The impedance of the healed metal wire 3 is in the same order as the metal wire 3 without a crack 7, and hence it can be said that the metal wire has a very high self-healing function. Further, as shown in FIG. 7, when the metal wire obtained after the experiment was observed with a scanning electron microscope (SEM), there were observed gold nanoparticles bridging the crack 7.

Figure 8:
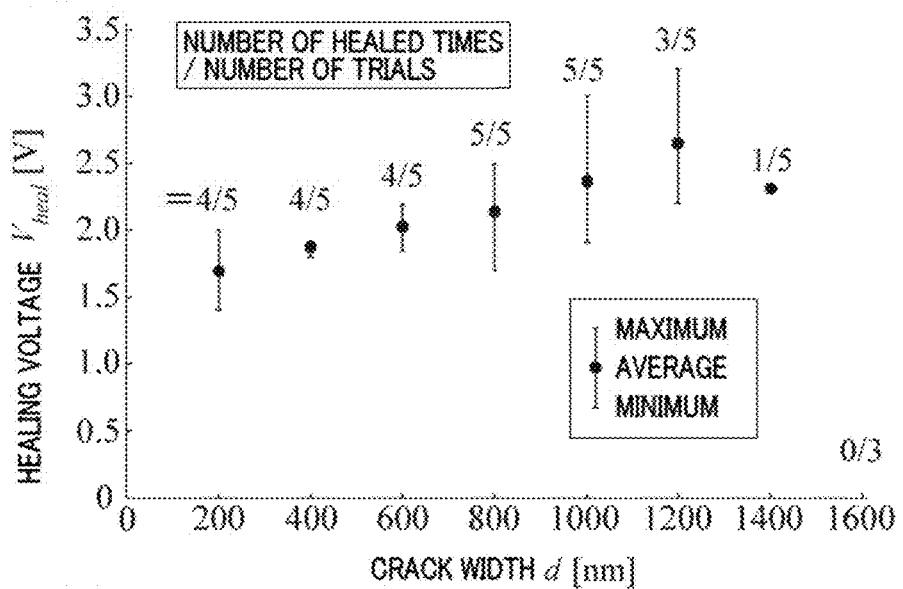
FIG. 8 is a graph for showing a relationship between the crack width and a healing voltage, according to the first embodiment.

FIG. 8 is a graph for showing the healing voltage $V_{heal}$ when an experiment similar to that of FIG. 6 is performed in cracks 7 having different widths. In this case, the experiment was performed five times for each of cracks 7 having widths ranging from 200 nm to 1,600 nm. In FIG. 8, the fraction represents the number of healed times to the number of trials.

Figure 9:
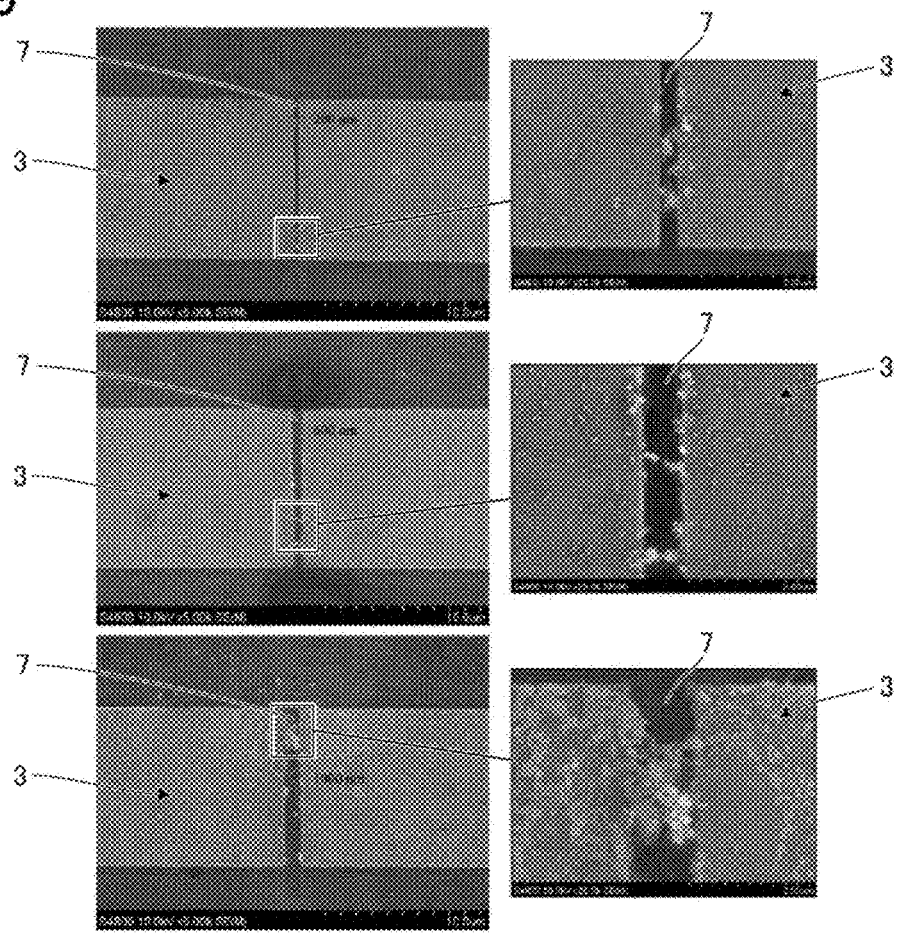
FIG. 9 is a photograph of a metal wire obtained after an experiment when the crack width is each of 200 nm, 600 nm, and 1,000 nm, according to the first embodiment.
Figure 10:
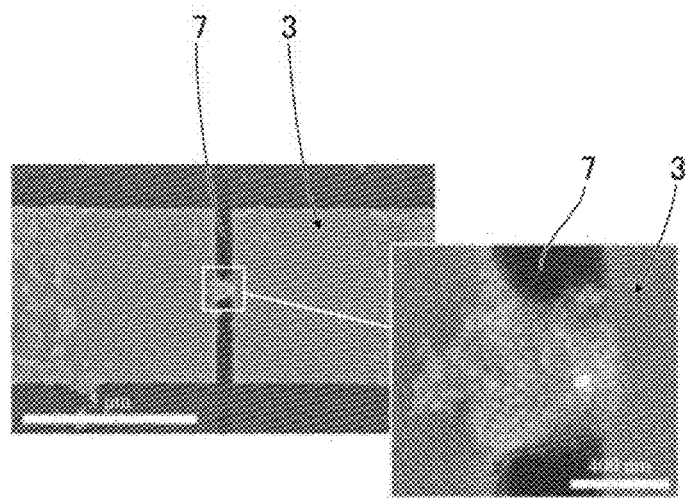
FIG. 10 is a photograph of a metal wire obtained after an experiment when the crack width is 400 nm, according to the first embodiment.

FIG. 9 is a photograph of the metal wire 3 obtained after the experiment when the width of the crack 7 is each of 200 nm, 600 nm, and 1,000 nm. Similarly, FIG. 10 is a photograph of the metal wire 3 obtained after the experiment when the width of the crack 7 is 400 nm.

As a result of the experiment, for example, when the width of the crack 7 was 200 nm, the healing was succeeded four times in five trials, and the average of the healing voltages $V_{heal}$ when the healing was succeeded was 1.7 V. When the width of the crack 7 was 1,000 nm or less, the healing was succeeded four times or more in five trials, and even when the width of the crack 7 was 1,200 nm or less, the healing was succeeded three times or more in five trials. Further, the healing voltage $V_{heal}$ tended to increase as the width of the crack 7 increased, and the average value of the healing voltage $V_{heal}$ changed from 1.70 V to 2.50 V while the width of the crack 7 ranged from 200 nm to 1,200 nm. This reason is because, as is understood from Formula 2, the increase in width of the crack 7 decreases the effective value $E_{rms}$ of the electric field intensity, and thus a larger voltage is necessary for the electric field trapping.

Meanwhile, when the width of the crack 7 increased to 1,400 nm, the crack was healed only once in five trails, and the crack did not heal in the case of 1, 600 nm. In an un-healed metal wire 3, when the amplitude $V_{amp}$ of the applied AC voltage became around 3.00 V, air bubbles were generated around the crack 7. When the voltage was further increased, the metal wire 3 melted. When the amplitude $V_{amp}$ of the application voltage exceeds 3.0 V, it is considered that electrolysis of the solution and the metal wire 3 starts, or boiling of the solution and melting of the metal wire 3 by the Joule heat start. Therefore, in the experiment, it was verified whether the wire was healed at up to 3.0 V.

The difference between the maximum value and the minimum value of the healing voltage $V_{heal}$ was about 1.10 V at the maximum. This reason is considered to be because the healing voltage $V_{heal}$ is not a voltage at which the electric field trapping starts, but is a voltage at which the gold nanoparticles are aggregated to bridge the crack 7. In the measurement in FIG. 6, the voltage amplitude $V_{amp}$ is changed after waiting for several tens of seconds for each point, but the number of gold nanoparticles included in a region in which the dielectrophoretic force $F_{DEP}$ is effective is stochastic, and the number of the aggregated gold nanoparticles changes every time. This is considered the reason why the healing voltage $V_{heal}$ varies. Actually, as represented by the error bars in FIG. 8, the variation of the healing voltage $V_{heal}$ is large even in cracks 7 having the same width, and the crack 7 is not always healed when the width of the crack 7 is small. Therefore, it is considered that the healing process includes a stochastic process. However, it was concluded that a crack 7 having a width of 1,000 nm or less was almost able to be healed through voltage application of 3.0 V or less.

Figure 11:
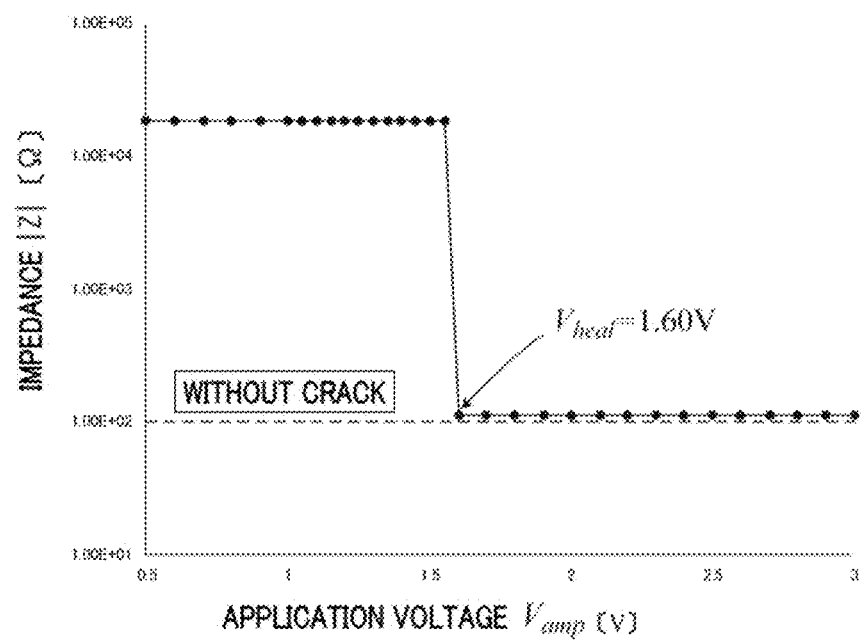
FIG. 11 is a graph for showing a relationship between amplitude of the application voltage and impedance of a metal wire as an experiment example using a flexible substrate, according to the first embodiment.

Subsequently, an experiment was performed on the stretchable flexible substrate 2 instead of the glass substrate 102. In this experiment, poly(dimethylsiloxane) (PDMS) was used for the flexible substrate 2. On the PDMS substrate, a gold wire having a width of 10 μm and a thickness of 100 nm was formed, and a crack 7 having a width of 270 nm was formed by FIB processing. The crack 7 was healed under the same condition as that for the glass substrate 102. As a result, the healing voltage $V_{heal}$ was 1.60 V. FIG. 11 is a graph for showing the measurement result of how the impedance |Z| of the metal wire 3 changes when the voltage amplitude $V_{amp}$ is increased from 0.50 V to 3.00 V.

Figure 12:
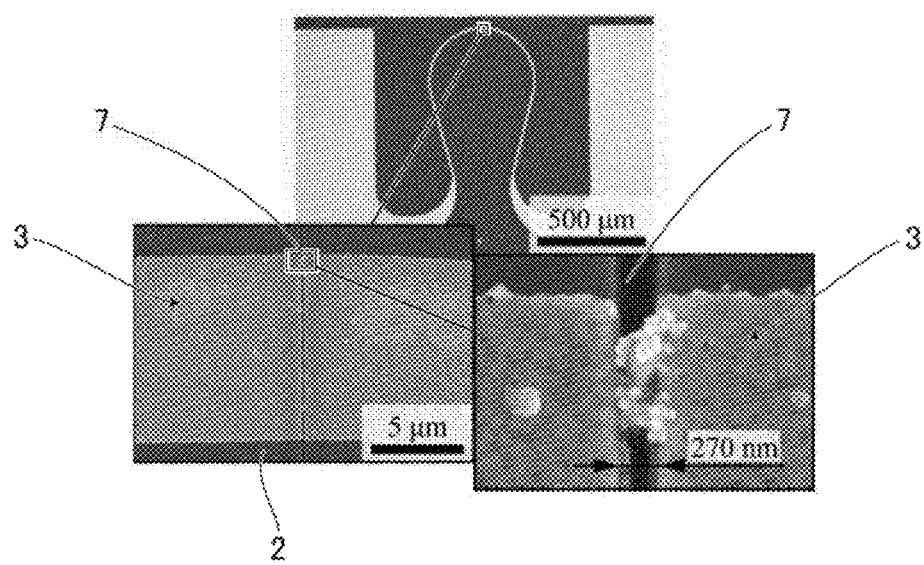
FIG. 12 is a photograph of a metal wire obtained after an experiment when the crack width is 270 nm, according to the first embodiment.

When the glass substrate 102 is changed to the PDMS substrate, it is considered that the magnitudes of the van der Waals' force $F_{VDW}$ and the electrostatic repulsive force $F_{ES}$, and the sectional shape of the crack 7 may change. However, the healing voltage $V_{heal}$ in the experiment was equivalent to that in the case of the glass substrate 102. This reason is considered to be because the thickness of the gold wire is 100 nm, and thus the gold wire is less affected by the van der Waals' force $F_{VDW}$ and the electrostatic repulsive force $F_{ES}$ received from the PDMS substrate. FIG. 12 is a microscope photograph and an SEM photograph of the crack 7 after the metal wire 3 was healed, when the width of the crack 7 was 270 nm. Similarly to the experiment performed on the glass substrate 102, the gold nanoparticles bridged the crack 7. In other words, it was found that, even on the flexible substrate 2 using PDMS, the gold wire was able to be self-healed by the electric field trapping phenomenon of the gold nanoparticles.

As described above, for the experiment wire 101 in which the gold wire having a width of 10 μm, a thickness of 100 nm, and a length of 1 mm was formed on the glass substrate 102, and a crack 7 having a width ranging from 200 nm to 1,600 nm was generated in the gold wire, the healing experiment of the gold wire was performed with use of an aqueous solution having dispersed therein gold nanoparticles having a particle concentration of $7.15 \times 10^{10}$ particles/ml and a radius of 20 nm. As a result, it was found that, in the gold wire with the crack 7 having a width ranging from 200 nm to 1,200 nm, when an AC voltage having a frequency of 100 kHz and an amplitude $V_{amp}$ ranging from 1.70 V to 2.50 V was applied from the power supply 15 to the gold wire, an electric field trapping phenomenon was caused to the gold nanoparticles such that the gold nanoparticles bridged the crack 7, and thus the gold wire was able be healed. Further, it was found that the impedance |Z| of the healed gold wire was reduced to the order of $10^1 \Omega$, which was the same as that before the crack 7 was generated, and thus high electric conductivity was able to be maintained.

In another experiment, the gold wire having a width of 10 μm and a thickness of 100 nm was formed on the PDMS substrate, and a crack 7 having a width of 270 nm was generated in the gold wire. In this case, the electric field trapping phenomenon was caused to the gold nanoparticles at the healing voltage $V_{heal}$ of 1.60 V such that the gold nanoparticles bridged the crack 7, and thus the gold wire was able to be healed. This result was equivalent to the experiment result on the glass substrate 102.

Next, in order to research the particle diameter dependence of the gold nanoparticles, the experiment wire 101 and the glass substrate 102 were used similarly to that in FIG. 5, there was performed a healing experiment for a crack 7 artificially formed on the glass substrate 102. The force acting on the metal nanoparticles is represented by the total force $F_{Total}$ as in Formula 1 described above. Each force represented on the right-hand side of Formula 1 is affected by the particle diameter of the metal nanoparticles. $F_{VDW}+F_{ES}$, which is the sum of the van der Waals' force $F_{VDW}$ and the electrostatic repulsive force $F_{ES}$, is proportional to r, and the dielectrophoretic force $F_{DEP}$ is proportional to $r^3$ (r is the particle radius of the metal nanoparticles). Therefore, it is predicted that the effect of healing the crack 7 differs depending on the difference in particle diameter of the gold nanoparticles.

In the experiment, on the glass substrate 102, a gold wire having a width of 10 μm, a thickness of 500 nm, and a length of 1 mm was formed by photolithography. After that, there was artificially formed, by focused ion beam (FIB) processing, a crack 7 corresponding to a disconnected region crossing the metal wire 3. Further, the experiment was performed with use of two types of gold nanoparticles having a radius of 20 nm and a radius of 200 nm. The crack width was ranged from 250 nm to 1,250 nm when the particles having a radius of 20 nm were used, and was ranged from 500 nm to 3,500 nm when the particles having a radius of 200 nm were used. As the aqueous solution having the gold nanoparticles dispersed therein, in order to adjust conditions other than the particle radius as uniform as possible, there were used 741981 produced by Sigma-Aldrich Co. LLC, having a particle concentration of $7.2\times10^{10}$ particles/ml and a radius of 20 nm, and 742090 produced by Sigma-Aldrich Co. LLC, having a particle concentration of $1.9\times10^8$ particles/ml and a radius of 200 nm. Then, an AC voltage of 100 KHZ was applied by an LCR meter corresponding to the power supply 15, and simultaneously impedance (AC resistance value) |Z| was measured by a four-terminal method.

Figure 13:
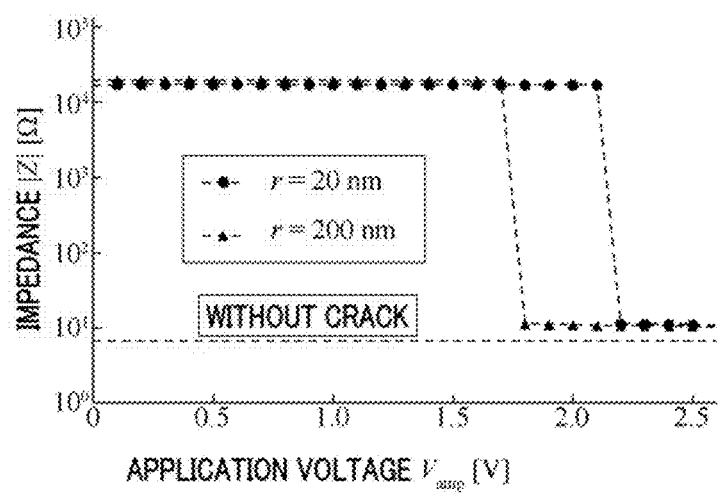
FIG. 13 is a graph for showing a relationship between amplitude of the application voltage and impedance of a metal wire as another experiment example using a glass substrate when a particle radius of the metal nanoparticles is changed, according to the first embodiment.
Figure 14:
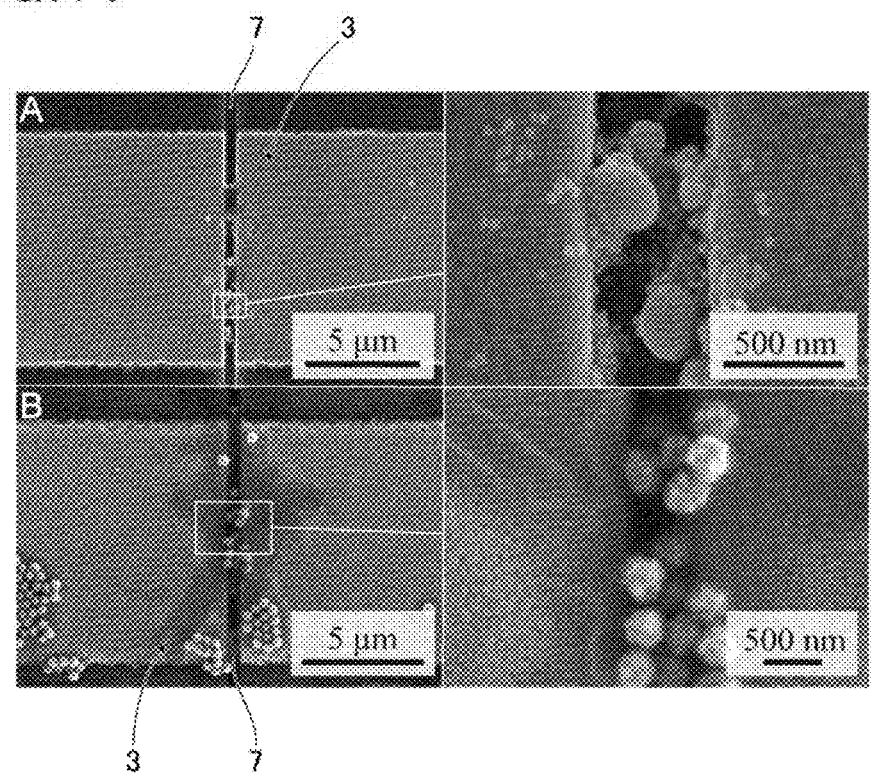
FIG. 14 is a photograph of a metal wire obtained after an experiment when a nanoparticle radius is 20 nm [A] and a radius is 200 nm [B], and when the crack width is 500 nm, according to the first embodiment.

FIG. 13 is a measurement result of how the impedance |Z| of the metal wire 3 changes when the voltage amplitude $V_{amp}$ is increased from 0.1 V to 2.5 V in the crack 7 having a width of 500 nm. In FIG. 13, in the case of using particles having a radius of 20 nm, when the voltage amplitude $V_{amp}$ is 2.2 V, and in the case of using particles having a radius of 200 nm, when the voltage amplitude $V_{amp}$ is 1.8 V, the impedance |Z| is dropped sharply from the order of $10^4 \Omega$ to the order of $10^1 \Omega$. After that, even when the application voltage to the metal wire 3 is increased, the impedance |Z| is not changed. It is found that the healing voltage $V_{heal}$ at which the metal wire 3 is considered to be healed by bridging the crack 7 with the gold nanoparticles aggregated by the electric field trapping can be decreased by increasing the particle diameter of the gold nanoparticles. Further, as shown in FIG. 14, when the metal wire obtained after the experiment was observed with a scanning electron microscope, there were observed gold nanoparticles bridging the crack 7. As shown in part A of FIG. 14, when the particles had a radius of 20 nm, there was observed a state in which the aggregated particles melted, and aggregates each having a size of several hundreds of nm were generated.

Figure 15:
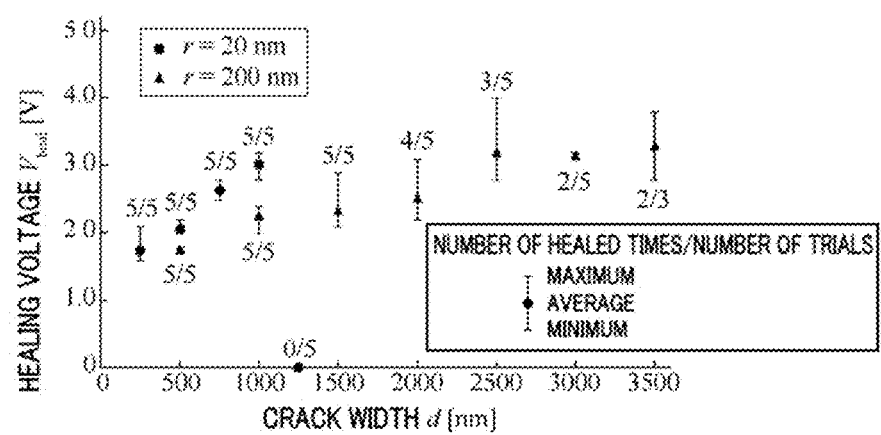
FIG. 15 is a graph for showing a relationship between the crack width and the healing voltage, according to the first embodiment.

FIG. 15 is a graph for showing the healing voltage $V_{heal}$ when an experiment similar to that of FIG. 13 is performed in cracks 7 having different widths. In this case, the experiment was performed five times (three times only in the case of the width of 3,500 nm) for the crack 7 having a width ranging from 250 nm to 1,600 nm in the case of using the particles having a radius of 20 nm, and for the crack 7 having a width ranging from 500 nm to 3,500 nm in the case of using the particles having a radius of 200 nm. In FIG. 15, the fraction represents the number of healed times to the number of trials.

As a result of the experiment, in the same particle radius, when the width of the crack 7 was increased, the voltage at which the healing succeeded was increased. When the particle radius was 20 nm, the crack 7 having a width up to 1,000 nm was healed with an application voltage having an amplitude $V_{amp}$ of 3.2 V or less, and when the particle radius was 200 nm, the crack 7 having a width up to 3,500 nm was healed with an application voltage having an amplitude $V_{amp}$ of 4.0 V or less. Further, when the gold nanoparticles having the particle radius of 200 nm were used, as compared to the case where the gold nanoparticles having the particle radius of 20 nm were used, the voltage at which the healing occurred with respect to the width of each crack 7 was smaller, and a larger crack was able to be healed at the same application voltage.

Next, actions and effects of the self-healing wire 1 illustrated in FIG. 1 are described. In the self-healing wire 1 of this embodiment, for example, the flexible substrate 2 and the container 12 made of PDMS have flexibility and stretchability, and hence the self-healing wire 1 can be arbitrarily bent or stretched by an external force. In this regard, hitherto, flexible displays and flexible sensor sheets have been actively developed. Many of those flexible devices have flexibility to be bendable to a certain curvature radius, but do not have stretchability.

Further, when the self-healing wire 1 is forcedly bent or stretched, the metal wire 3 is partially disconnected, and a crack 7 is generated. In this case, when both terminals of the power supply 15 are connected to the terminal portions 8, and the above-mentioned AC voltage is applied to the metal wire 3 from the power supply 15, an electric field is generated in a part of the crack 7. Thus, there is caused such an electric field trapping phenomenon that only the dielectrophoretic force $F_{DEP}$ acts on the metal nanoparticles 4 in the liquid 5, and the metal nanoparticles 4 bridge the crack 7, to thereby selectively heal the metal wire 3 only in the part of the crack 7. With the self-healing function of the self-healing wire 1, the electric wire can have high electric conductivity and high resistance to stretching.

As described above, the self-healing wire 1 of this embodiment includes the metal wire 3 (a kind of electric wire), arranged on the flexible substrate 2 (a kind of stretchable material), and has, as a healing portion for the crack 7 generated in the metal wire 3, unique hybrid structure in which the metal wire 3 is covered with the liquid 5 (a kind of fluid) having dispersed therein the metal nanoparticles 4 (a kind of conductive particles).

In this case, even when a crack 7 is generated in the metal wire 3, with use of a force that selectively acts only in the part of the crack 7, the crack 7 is bridged by the metal nanoparticles 4 in the liquid 5. In this manner, the metal wire 3 is selectively healed only in the part of the crack 7. Therefore, unlike the related art, with use of the hybrid structure including the solid metal wire 3 and the liquid 5 containing the metal nanoparticles 4, the self-healing wire 1 having both of high conductivity and high stretchability can be provided.

Further, in the self-healing wire 1 of this embodiment, the metal wire 3 includes the terminal portions 8 configured to enable voltage application to the metal wire 3, to thereby generate an electric field only in the part of the crack 7.

In this case, even when a crack 7 is generated in the metal wire 3 due to the stretching of the flexible substrate 2, the terminal portions 8 are used to apply a desired voltage to the metal wire 3. In this manner, as the force that selectively acts only in the part of the crack 7, an electric field trapping phenomenon by the dielectrophoretic force $F_{DEP}$ can be caused to the metal nanoparticles 4 in the liquid 5. With this, the aggregated metal nanoparticles 4 bridge the crack 7, and thus the metal wire 3 can be healed only with a physical force without applying heat from the outside, for example.

Further, the self-healing wire 1 of this embodiment has a feature in that the conductive particles are the metal nanoparticles 4 corresponding to metal particles. Particularly when the metal nanoparticles 4 are used as the conductive particles, the self-healing wire 1 having both of high conductivity and high stretchability can be provided.

Further, the self-healing wire 1 of this embodiment has a feature in that the flexible substrate 2. Thus, even when a crack 7 is generated in the metal wire 3 due to the stretching of the flexible substrate 2, the metal wire 3 can be selectively healed in the part of the crack.

Further, the self-healing wire 1 of this embodiment has a feature in that the electric wire is the metal wire 3. Particularly when the metal wire 3 is used as the electric wire, the self-healing wire 1 having both of high conductivity and high stretchability can be provided.

Figure 16:
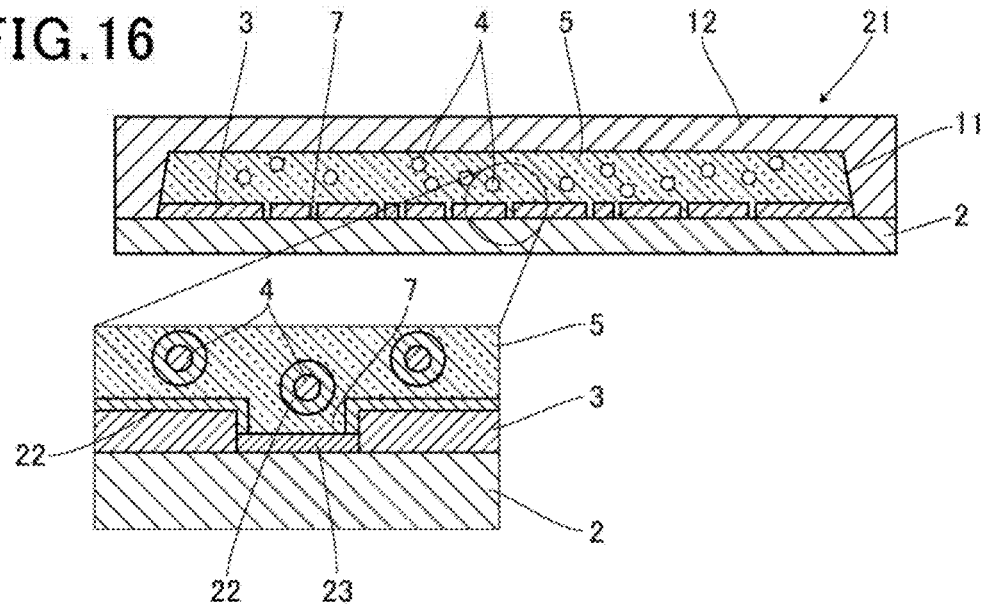
FIG. 16 is a vertical sectional view for illustrating basic structure of a self-healing wire according to a second embodiment.

FIG. 16 is an illustration of basic structure of a self-healing wire 21 according to a second embodiment of the present invention. In this embodiment, instead of the method of using the electric field as in the first embodiment, there is proposed a method of self-healing the crack 7 generated in the metal wire 3 particularly by surface modification as a method of using a difference in surface. The stretchable wire 21 in this embodiment does not include the terminal portions 8 or the power supply 15 provided in the first embodiment. Instead, the surfaces of the metal nanoparticles 4 and the surface of the metal wire 3, which are in contact with the liquid 5, are charged with negative charges 22, and the surface of the flexible substrate 2, which is in contact with the liquid 5 in the part of the crack 7, is charged with a positive charge 23.

In this embodiment, even without voltage application to the metal wire 3, the above-mentioned van der Waals' force $F_{VDW}$ and an electrostatic force act on the metal nanoparticles 4. Although control of the van der Waals' force (attractive force) $F_{VDW}$ is difficult, whether the electrostatic force acts as an attractive force or a repulsive force is determined depending on whether the surface is charged positively or negatively, and this state can be easily changed by surface molecular modification. Therefore, as illustrated in FIG. 16, when electrostatic force applying means (not shown) for negatively charging the surfaces of the metal nanoparticles 4 and the surface of the metal wire 3 in the liquid 5, and for positively charging the surface of the flexible substrate (silicone rubber) 2 in the liquid 5 is added to the stretchable wire 21, the metal nanoparticles 4 bridge the part of the crack 7 in which the flexible substrate 2 is exposed, and thus the metal wire 3 can be selectively healed only in this part. This method is superior to the method of using the electric field as in the first embodiment in that a voltage is unnecessary for healing and there is no problem of leakage current or breakdown.

As described above, the self-healing wire 1 of this embodiment further has a configuration in which the surface of the metal wire 3 is charged with the negative charge 22, which has the same polarity as the surfaces of the metal nanoparticles 4, and the surface of the flexible substrate 2, in contact with the liquid 5 in the part of the crack 7 is charged with the positive charge 23, which has a different polarity from that of the surfaces of the metal nanoparticles 4.

In this case, even when a crack 7 is generated in the metal wire 3 due to the stretching of the flexible substrate 2, particularly with use of a difference in surface molecular modification as the force that selectively acts only in the part of the crack 7, the electrostatic force can act on the metal nanoparticles 4 in the liquid 5. With this, the metal nanoparticles 4 bridge the part of the crack 7 in which the flexible substrate 2 is exposed, and thus the metal wire 3 can be healed only with a physical force without applying heat from the outside. Further, voltage application is unnecessary for healing, and the problems of leakage current and breakdown can be avoided.

In the above-mentioned first embodiment and second embodiment, the conductive particles may be, other than the metal particles, particles of a compound containing metal, alloy particles of solder or the like, semiconductor particles, conductive polymers, carbon particles of carbon nanotube or fullerene, or a combination thereof. Even with the semiconductor particles and the conductive polymers, the above-mentioned van der Waals' force $F_{VDW}$, electrostatic repulsive force $F_{ES}$, and dielectrophoretic force $F_{DEP}$ can act, and further the charges of the surface can be changed by surface modification. Further, in the first embodiment and the second embodiment, as the fluid in which the conductive particles are dispersed, instead of the liquid 5, a gaseous matter (air, gas, vacuum, or the like) may be used. This may be particularly important for space applications.

Figure 17:
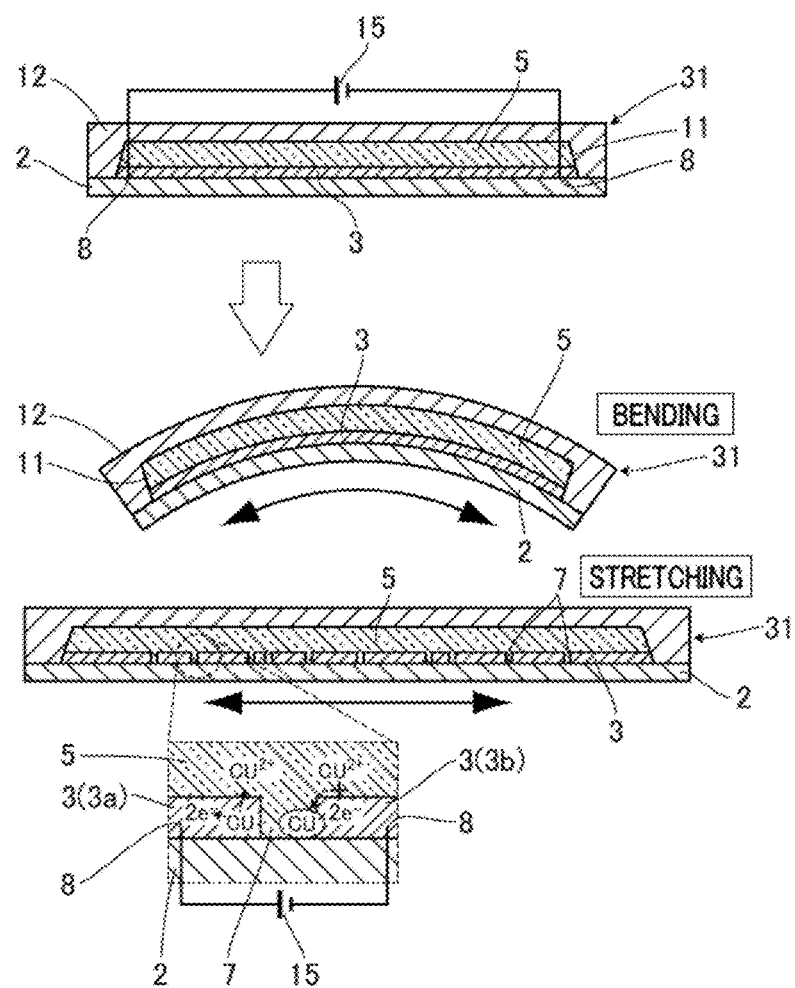
FIG. 17 is a vertical sectional view for illustrating basic structure of a self-healing wire according to a third embodiment, and a schematic view for illustrating a healing state by electrolytic plating.

FIG. 17 is basic structure of a self-healing wire 31 according to a third embodiment of the present invention. In this embodiment, as a method of using the electric field as in the first embodiment, there is particularly proposed a method of using electrolytic plating, in which one metal wire 3 with a crack 7 is set as an anode 3A, another metal wire 3 is set as a cathode 3B, and a DC voltage is applied therebetween from the power supply 15. In the stretchable wire 31 herein, in order to perform electrolytic plating by the electric field generated only in the part of the crack 7, the metal wire 3 is arranged while being covered with the liquid 5 being an aqueous solution having dissolved therein, for example, metal ions such as copper ions $Cu^{2+}$ instead of the metal nanoparticles 4.

When the stretchable wire 31 is forcedly bent or stretched, the metal wire 3 is partially disconnected, and a crack 7 is generated. In this embodiment, when both terminals of the power supply 15 are connected to the terminal portions 8, and the DC voltage is applied to the metal wire 3 from the power supply 15, an electric field is generated only in the part of the crack 7. Thus, through an electrochemical reaction, the metal ions dissolved in the liquid 5 are deposited as a solid metal on the anode 3A side of the metal wire 3. Then, the solid metal bridges the crack 7, to thereby selectively heal the metal wire 3 only in the part of the crack 7.

In the above-mentioned electrochemical reaction, there occurs a reaction that metal is dissolved in the liquid 5 as metal ions on the cathode 3B side of the metal wire 3. However, in electrolytic plating, an electric field is concentrated on a sharp corner, and thus plating is performed faster than other parts. With use of this difference in plating speed, although the entire metal wire 3 may not be healed, a part of the metal wire 3 is connected again.

As described above, the self-healing wire 31 of this embodiment includes the metal wire 3 arranged on the flexible substrate 2, and has, as the healing portion for the crack 7 generated in the metal wire 3 due to the stretching of the flexible substrate 2, unique hybrid structure in which the metal wire 3 is covered with the liquid 5 having metal ions dissolved therein.

In this case, even when a crack 7 is generated in the metal wire 3 due to the stretching of the flexible substrate 2, with use of the force that selectively acts only in the part of the crack 7, the solid metal deposited from the metal ions in the liquid 5 bridges the crack 7. In this manner, the metal wire 3 is selectively healed in the part of the crack 7. Therefore, unlike the related art, with use of the hybrid structure including the solid metal wire 3 and the liquid 5 containing metal ions, the self-healing wire 31 having both of high conductivity and high stretchability can be provided.

Further, in the self-healing wire 31 of this embodiment, the metal wire 3 includes the terminal portions 8 configured to enable voltage application to the metal wire 3, to thereby generate an electric field only in the part of the crack 7.

In this case, even when a crack 7 is generated in the metal wire 3 due to the stretching of the flexible substrate 2, the terminal portions 8 are used to apply a desired voltage to the metal wire 3. In this manner, with electrolytic plating using an electric field as the force that selectively acts only in the part of the crack 7, a solid metal can be deposited from the metal ions in the liquid 5. With this, the deposited solid metal bridges the crack 7, and thus the metal wire 3 can be healed only with an electrochemical force without applying heat from the outside.

Figure 18:
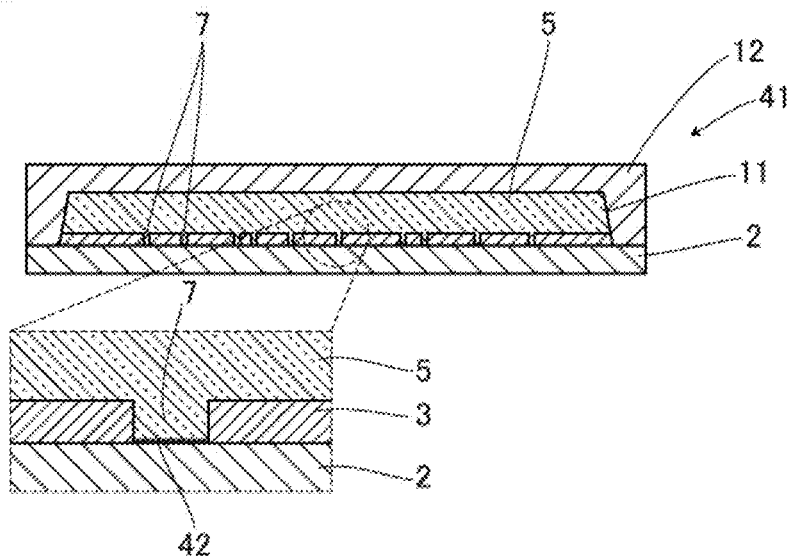
FIG. 18 is a vertical sectional view for illustrating basic structure of a self-healing wire according to a fourth embodiment, and a schematic view for illustrating a healing state by electroless plating.

FIG. 18 is basic structure of a self-healing wire 41 according to a fourth embodiment of the present invention. In this embodiment, as a method of using the difference in surface as in the second embodiment, there is particularly proposed an electrochemical method of using electroless plating. Similarly to the third embodiment, the stretchable wire 41 in this embodiment uses an aqueous solution having metal ions dissolved therein as the liquid 5, but the terminal portions 8 and the power supply 15 are omitted unlike the third embodiment. Instead, in order to perform electroless plating only on the surface of the flexible substrate 2 made of a resin, the flexible substrate 2 is subjected to pre-processing.

When the stretchable wire 41 is forcedly bent or stretched, the metal wire 3 is partially disconnected, and a crack 7 is generated. In this embodiment, when the flexible substrate 2 subjected to pre-processing is exposed in the part of the crack 7 to be in contact with the liquid 5, through an electrochemical reaction, the metal ions dissolved in the liquid 5 are deposited on the surface of the flexible substrate 2 as a plated layer 42 of the solid metal. Then, the plated layer 42 bridges the crack 7, to thereby selectively heal the metal wire 3 only in the part of the crack 7.

As described above, the self-healing wire 41 of this embodiment further has a configuration in which a solid metal is deposited as the plated layer 42 from the metal ions by electroless plating only on the surface of the flexible substrate 2, which is in contact with the liquid 5 in the part of the crack 7.

In this case, even when a crack 7 is generated in the metal wire 3 due to the stretching of the flexible substrate 2, with electroless plating using the difference in surface modification as the force that selectively acts only in the part of the crack 7, the solid metal can be deposited as the plated layer 42 from the metal ions in the liquid 5 only on the surface of the flexible substrate 2, which is in contact with the liquid 5 in the part of the crack 7. With this, the deposited plated layer 42 bridges the crack 7, and thus the metal wire 3 can be healed only with an electrochemical force without applying heat from the outside. Further, voltage application is unnecessary for healing, and the problems of leakage current and breakdown can be avoided.

In the above-mentioned third embodiment and fourth embodiment, the liquid 5 having the metal ions dissolved therein may be a fluid containing or having dissolved therein a compound containing metal, compound ions, or a combination thereof.

Figure 19:
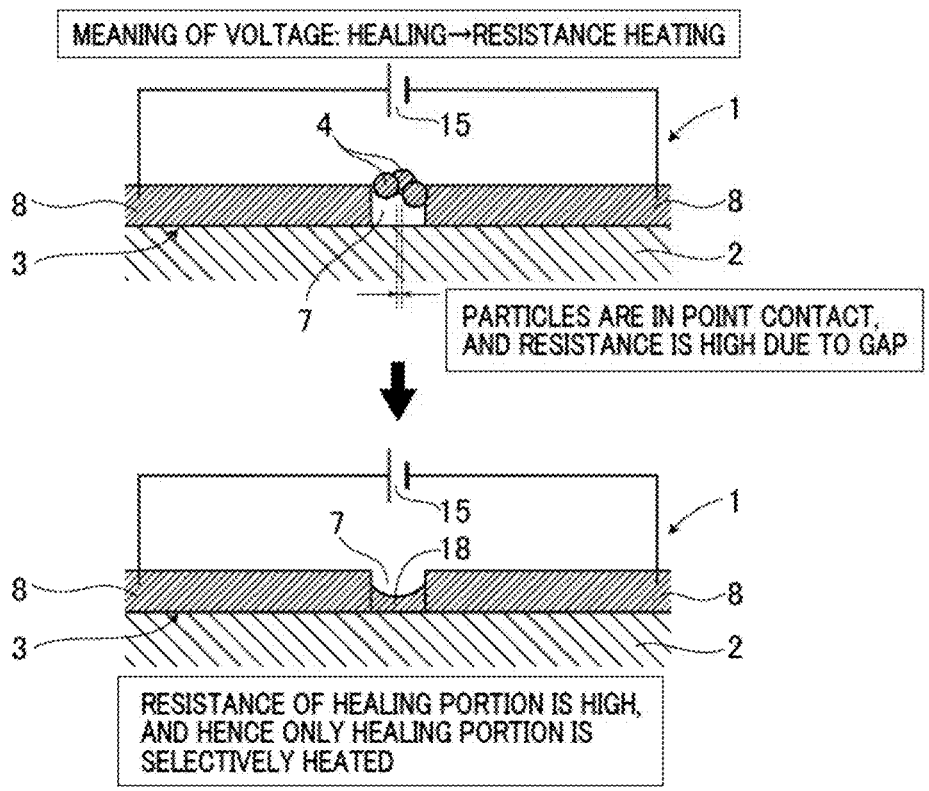
FIG. 19 is a diagram for schematically illustrating a self-healing wire according to a fifth embodiment.

With reference to FIG. 19 to FIG. 22, a fifth embodiment of the present invention is described. In this embodiment, the metal nanoparticles 4 that have bridged the crack 7 are melted, to thereby reduce the resistance after the healing. Specifically, after self-healing is performed by electric field trapping of the metal nanoparticles 4 or surface modification, as illustrated in FIG. 19, the power supply 15 is used to apply a voltage to the metal wire 3 corresponding to a wire portion (in the case of electric field trapping, a voltage is applied for healing as well, and hence the voltage can be continuously applied). The healing portion is higher in resistance than the wire portion, and hence the healing portion is selectively heated by the Joule heat (resistance heating). Further, it is known that the metal nanoparticles 4 are lower in melting point than a bulk metal being a block having a certain size, and hence it is considered that the metal nanoparticles 4 melt earlier than the wire portion by the Joule heat. Therefore, as also described in the first embodiment, the metal nanoparticles 4 in the healing portion melt, to thereby form a melted portion 18 in the crack 7. When the metal nanoparticles 4 of a certain amount bridge the crack 7, the metal nanoparticles 4 in the healing portion melt to fill the gap of the crack 7 with the melted portion 18. Therefore, the resistance can be reduced as compared to the case where the crack 7 is bridged simply with the metal nanoparticles 4.

Further, as a heat source for selectively heating the healing portion, instead of the above-mentioned Joule heat, the entire self-healing wire 1 may be heated, or laser heating may be performed. Also in this case, it is known that the metal nanoparticles 4 are lower in melting point than a bulk metal being a block having a certain size, and hence only the metal nanoparticles 4 can be melted even when the entire self-healing wire 1 is heated.

Figure 20:
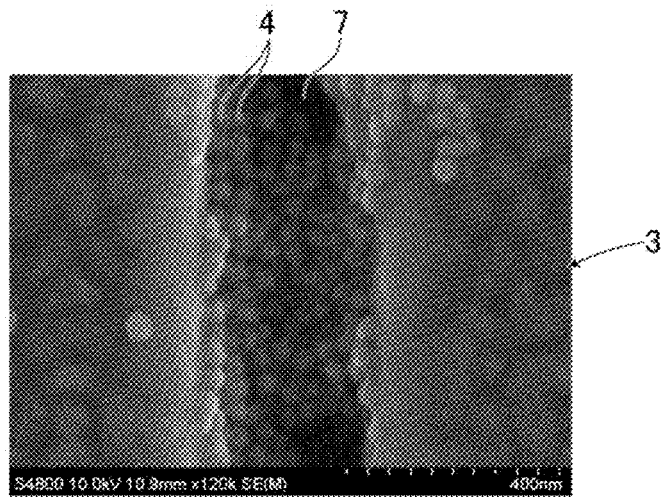
FIG. 20 is a photograph of a state (not melted) in which gold nanoparticles are trapped in a crack portion, according to the fifth embodiment.
Figure 21:
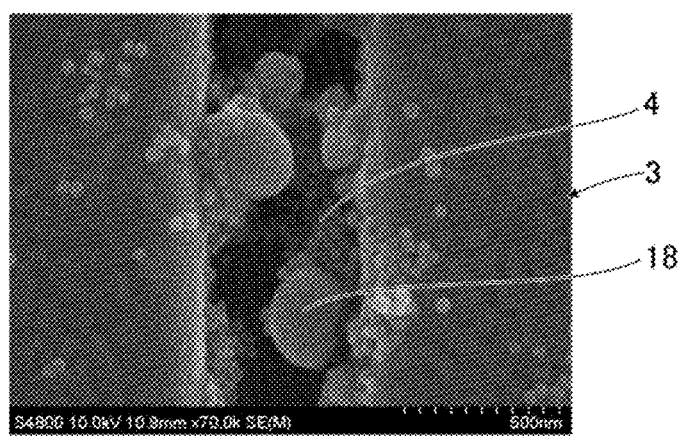
FIG. 21 is a photograph of a state in which the gold nanoparticles are partially melted by Joule heat (resistance heating), in which small particles have the original size and large balls are melted particles, according to the fifth embodiment.
Figure 22:
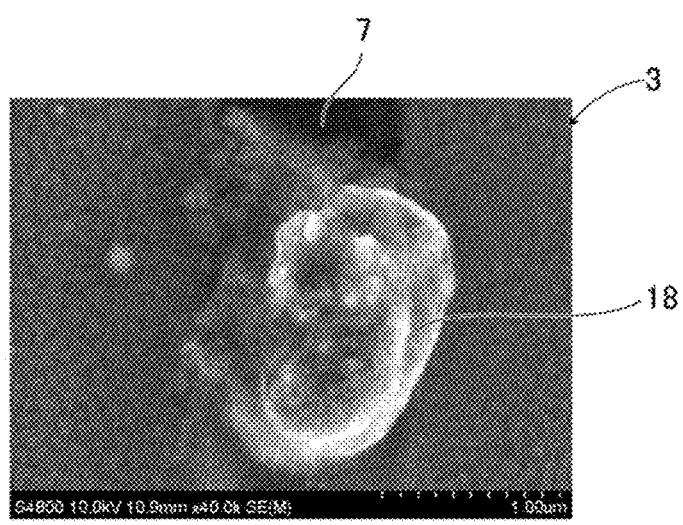
FIG. 22 is a photograph of a state in which the gold nanoparticles are significantly melted, according to the fifth embodiment.

How the gold nanoparticles bridging the crack portion actually melt is shown in FIG. 20 to FIG. 22. FIG. 20 is a photograph of a state in which the gold nanoparticles are trapped in the crack portion. FIG. 21 is a photograph of a state in which the gold nanoparticles are melted by the Joule heat (resistance heating), and a part of the gold nanoparticles are melted to form a large aggregate. FIG. 22 is a photograph of a state in which the gold nanoparticles greatly melt to form an aggregate.

The melting of the metal nanoparticles 4 with use of the Joule heat described in this embodiment is effective in electric field trapping using the metal nanoparticles 4 described in the first embodiment, or in surface modification described in the second embodiment, but may be employed also in combination with the electrolytic plating of the third embodiment or the electroless plating of the fourth embodiment. In other words, in the third embodiment and the fourth embodiment, the solid metal deposited in the part of the crack 7 is melted by the Joule heat earlier than the metal wire 3 with the voltage application to the metal wire 3. Even in this case, instead of the Joule heat, the entire self-healing wires 31 and 41 may be heated, or laser heating may be performed. Both of the second embodiment and the fourth embodiment are described as configurations not including the terminal portions 8 or the power supply 15, but when this embodiment is used in combination with the second embodiment or the fourth embodiment, the terminal portions 8 and the power supply 15 are necessary.

As described above, in this embodiment combined with the above-mentioned first embodiment or second embodiment, the metal nanoparticles 4, which correspond to the conductive particles, are melted by heat in the part of the crack 7 earlier than the metal wire 3, which corresponds to the electric wire.

In this case, after the crack 7 generated in the metal wire 3 is healed, only the conductive particles trapped in the part of the crack can be heated and melted. Thus, the resistance can be reduced as compared to the case where the crack 7 is bridged simply with the conductive particles.

Further, in this embodiment combined with the above-mentioned third embodiment or fourth embodiment, the solid metal deposited from the metal ions for bridging the crack 7 is melted by heat in the part of the crack 7 earlier than the metal wire 3.

In this case, after the crack 7 generated in the metal wire 3 is healed, only the solid metal deposited in the part of the crack 7 can be heated and melted. Thus, the resistance can be reduced as compared to the case where the crack 7 is bridged simply with the solid metal.

FIG. 23 is structure of the self-healing wire 1 around the crack 7 according to a sixth embodiment of the present invention. In FIG. 23, "type 1" represents a single metal wire 3 described in the first embodiment, and "type 2" represents a metal wire 3 divided into a plurality of parts described in this embodiment. This embodiment has the same configuration as the self-healing wire 1 of the first embodiment except for the shape of the metal wire 3.

In the metal wire 3 of "type 1", only one current path is formed between one end (for example, one terminal portion 8) and another end (for example, another terminal portion 8). Therefore, there is only one healing point when a crack 7 is generated in the metal wire 3. Therefore, although healing is finally achieved, a "disconnected" state temporarily occurs.

In contrast, in the metal wire 3 of "type 2", a plurality of current paths divided into a plurality of parts are formed between the one end and the another end. Therefore, there are a plurality of healing points when a crack 7 is generated in the metal wire 3, and hence it is possible to achieve a state in which several current paths among the plurality of current paths are connected. With this, although there is a variation in resistance value as the metal wire 3 depending on the number of connected portions, the moment of "disconnection" can be eliminated.

As described above, in the self-healing wire 1 of this embodiment, the metal wire 3 is formed so as to be divided into a plurality of parts, and thus a disconnected state can be avoided even during healing of the crack 7.

The shape of the metal wire 3 proposed in this embodiment is directly applicable to the above-mentioned other self-healing wires 21, 31, and 41.

FIG. 24A to FIG. 24E are an example of a method of manufacturing a stretchable device 51 according to a seventh embodiment of the present invention. A specific method of manufacturing the stretchable device 51 is described herein, but the method is a limited one. The present invention is not limited to this manufacturing method, and other methods may be employed.

Now, the method of manufacturing the stretchable device 51 is sequentially described. First, in FIG. 24A, in this case, for example, in order to form a substrate 54 having a rigidity distribution, there are used two types of base materials that are significantly different in Young's modulus, such as a high stretchability material 55, e.g., a silicone rubber (PDMS) substrate, which is not disconnected even when being stretched or bent, and a high rigidity material 56, e.g., a Si substrate, which is higher in rigidity than the high stretchability material 55 and is hardly deformed even when a force is applied. Those materials are used for forming a strain distribution when the substrate 54 is pulled in the lateral direction of FIG. 24A. A similar effect can be exerted with use of the same material when the thickness of each base material is changed or a hole is formed in only one of the base materials. In this embodiment, the high stretchability material 55 is a silicone rubber substrate, and the high rigidity material 56 is a Si substrate. However, there are known types of silicone rubber that are different in Young's modulus by 10 times (when those materials are used as the two types of base materials, the strain is different by 1/10 times when the substrate is laterally pulled), and hence the entire substrate 54 can be made of a rubber material. In other words, the substrate 54 herein is not limited to each material and shape, and it is only required to form the substrate 54 with a first portion made of a stretchable base material (for example, the high stretchability material 55), and a second portion made of a base material higher in rigidity than the stretchable base material (for example, the high rigidity material 56). The high stretchability material 55 corresponds to the flexible substrate 2 described in the first embodiment to the sixth embodiment.

Subsequently in FIG. 24B, a metal wire layer 57 is formed by patterning on the surface of the substrate 54. The metal wire layer 57 corresponds to the metal wire 3 of gold or copper, which is described in the first embodiment to the sixth embodiment. Methods that have been used in the related art can be used, such as vapor deposition and thin film adhesion. In this case, the metal wire layer 57 is formed across the high stretchability material 55 and the high rigidity material 56. Particularly in the metal wire layer 57 formed on the surface of the high rigidity material 56, first electrodes 58A and 58B, second electrodes 59A and 59B, and third electrodes 60A and 60B, which each form a pair, are arranged. In FIG. 24B, the metal wire layer 57 is formed only on one surface of the substrate 54, but the metal wire layer 57 may be formed on both surfaces of the substrate 54.

Subsequently in FIG. 24C, in a part of the high rigidity material 56 of the substrate 54, an electric element 63, e.g., an IC is mounted. The electric element 63 is solder-connected to the third electrodes 60A and 60B of the metal wire layer 57. Even when the related-art electric element without resistance to stretching is used, as long as the wire portion including the high stretchability material 55 and the metal wire layer 57 formed on the surface of the high stretchability material 55 has the resistance to stretching and the healing function as described in the first embodiment to the sixth embodiment, the stretchable device 51 as a whole can finally have the resistance to stretching.

Subsequently in FIG. 24D, there is separately formed a sealing member 73 made of silicone rubber (PDMS), in which a patterned flow path portion 71, which corresponds to the above-mentioned sealing portion for the liquid 5, and a receiving portion 72 for the electric element 63 are recessed. Then, the sealing member 73 is bonded to the substrate 54 in the state of FIG. 24C. The bonding here refers to a method called PDMS-PDMS bonding, which is generally used when micro-flow channels and the like are formed. Thus, the bonding strength is strong, and the sealed liquid 5 does not leak. Further, silicone rubber is used for applications such as expansion as a balloon with air pressure and the like, and thus the bonded portion is not ripped by being pulled. Although silicone rubber has a rupture limitation as a matter of course, there is known silicone rubber that extends by 200% with respect to its original dimension. The sealing member 73 corresponds to the container 12 described in the first embodiment to the sixth embodiment, and the flow path portion 71 corresponds to the liquid sealing portion 11 described in the first embodiment to the sixth embodiment.

When the sealing member 73 and the substrate 54 are bonded to each other in this manner, the stretchable device 51 in the complete state is obtained as illustrated in FIG. 24E. In the complete state of the stretchable device 51, the liquid 5 received in the flow path portion 71 is sealed between the sealing member 73 and the substrate 54 under a state of being in contact with the metal wire layer 57 on the high stretchability material 55. Further, in order to enable electric connection between the stretchable device 51 and another electric device, the first electrodes 58A and 58B and the second electrodes 59A and 59B are exposed on the high rigidity material 56 without being covered with the sealing member 73.

The liquid 5 may be provided in the flow path portion 71 in advance when the sealing member 73 and the substrate 54 are bonded and sealed to each other. Instead, the liquid 5 may be injected from outside after the sealing, and then an injection port communicating to the flow path portion 71 may be closed. Further, considering the leakage current and the like, for example, when the flow path portion 71 of the sealing member 73 is formed so as to be sectioned such that the liquid 5 is not in contact with the electric element 63 as in FIG. 24E, such problems of leakage current and the like do not occur.

Figure 25:
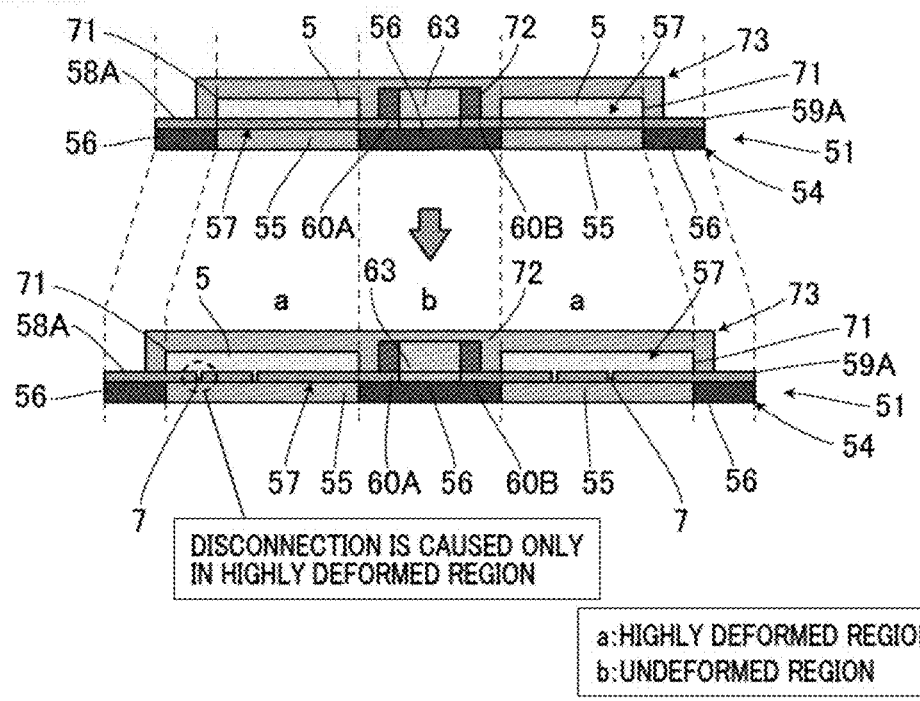
FIG. 25 is a schematic view for illustrating a strain distribution when the stretchable device is subjected to stretching deformation, according to the seventh embodiment.

FIG. 25 is a view for illustrating the reason why the "substrate 54 having the rigidity distribution" is used in FIG. 24A, and is a schematic illustration of the strain distribution when the stretchable device 51 is subjected to stretching deformation. In FIG. 25, when a uniform lateral force is applied to the complete stretchable device 51 to subject the stretchable device 51 to stretching deformation, an undeformed region in which the electric element 63 is mounted on the high rigidity material 56 is not deformed, but only a part of a highly deformed region including the lower high stretchability material 55 and the upper sealing member 73, which are both made of silicone rubber, is stretched. This highly deformed region corresponds to the self-healing wires 1, 21, 31, and 41 described in the first embodiment to the sixth embodiment. Therefore, when a crack 7 is generated in the metal wire 3 due to the stretching of the stretchable device 51, the metal wire 3 can be healed by the methods of the first embodiment to the sixth embodiment.

The above-mentioned method of manufacturing the stretchable device 51 itself is one example and is not such a special method, but the strain distribution can be arbitrarily controlled as the stretchable device 51 by using the substrate 54 having a rigidity distribution. Further, this embodiment has a feature in that a healing function is not required in the electric element 63, but is only required in a wire, that is, the metal wire layer 57. For example, studies of developing resistance to bending and stretching in functional elements such as an organic EL element and an organic semiconductor element have been actively conducted, but when the stretchable device 51 has the structure as illustrated in FIG. 24E, even when the electric element 63 including the functional element itself does not have stretchability, the stretchability and the healing function can be provided as the whole device. At present, an electric element 63 using an inorganic material is superior in terms of performance to an electric element 63 using an organic material. While leaving such related-art accumulated functional elements, a flexible stretchable device 51 having stretchability and a healing function can be achieved. This means that it is more realistic and faster in terms of industry to manufacture a flexible stretchable device 51 with use of an inorganic material than starting from material development of organic materials and the like. The stretchable device 51 in this embodiment can be regarded as a highly realistic approach.

Next, an example of the method of using the stretchable device 51 is described. In FIG. 24E, during normal usage, a drive voltage for the electric element 63 is applied across one first electrode 58A and one second electrode 59A, to thereby use the stretchable device 51. Meanwhile, for example, when the metal wire layer 57 connected to the first electrode 58A side is disconnected, a healing voltage is applied across the one first electrode 58A and the other first electrode 58B to heal the stretchable device 51. This method corresponds to an example in which the power supply configured to apply the drive voltage for the electric element 63 and the power supply configured to apply the healing voltage for the metal wire layer 57 (corresponding to the above-mentioned power supply 15) are divided. As other examples, it is considered that application of a healing voltage superimposed on a drive voltage and the like are preferred as the actual stretchable device 51. Further, in this embodiment, depending on the position at which the crack 7 is generated, any of the first electrodes 58A and 58B and the second electrodes 59A and 59B may be the terminal portions configured to enable application of the healing voltage to the metal wire layer 57.

As described above, when the metal wire layer 57 connected to the first electrode 58A side is disconnected, the healing voltage is applied across the one first electrode 58A and the other first electrode 58B. For example, in the first embodiment, the amplitude $V_{amp}$ of the AC voltage necessary for healing the metal wire layer 57 is 3 V or less, and hence, for example, when the operation voltage of the electric element 63 is 5 V, the electric element 63 is not damaged by the voltage applied for healing. Further, by changing the type (permittivity) of the liquid 5, the healing voltage can be decreased.

Figure 26:
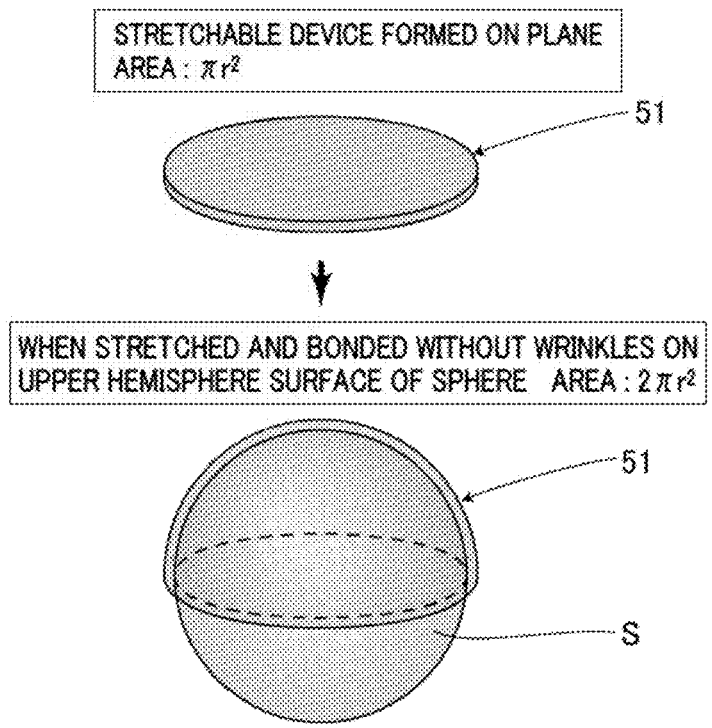
FIG. 26 is a schematic view for illustrating an example in which a flat-plate stretchable device is used while being bonded to a curved surface, according to the seventh embodiment.

FIG. 26 is an example of using the stretchable device 51, which has been formed into a planar shape and then bonded to a curved surface.

As applications of cases where the stretchable device 51 is used not only while being bent but also while being stretched, there are a first application in which stretching is required during usage, and a second application in which stretching is not required during usage, but is required for bonding to an object. As the first application, there is assumed a case where the stretchable device 51 is used while being mounted to a movable portion (elbow of a robot and the like). Further, also when the stretchable device 51 is achieved as a sensor sheet that is bonded to a human being a biological object to acquire body temperature or health information, the stretchable device 51 requires stretchability along with the stretching of the biological object.

As the second application, when the stretchable device 51 is used while being bonded to, for example, a column as an object, the entire column can be covered with the stretchable device 51 simply by bending the flat sheet-like stretchable device 51, but when the object is a sphere, the entire sphere cannot be covered with the stretchable device 51 unless the flat sheet-like stretchable device 51 is stretched. With consideration of the Gaussian curvature of the curved surface being the bonding object, it is known whether only bending deformation is required or also stretching deformation is required. That is, considering the usage of the stretchable device 51 while being bonded to the curved surface of the object whose Gaussian curvature is not zero, the stretchable device 51 is required to be stretchably deformable.

For example, assuming that the stretchable device 51 (having an area of $\pi r^2$) formed into a disc sheet shape having a radius of r as in FIG. 26 is bonded to a hemisphere surface (having an area of $2\pi r^2$) of a sphere object S, the area is increased by two times, and hence the homothetic ratio becomes $\sqrt{2}$ times, and the elongation (strain) is increased by 41% ($=(\sqrt{2}-1)\times100$) with respect to the shape before stretching. A case where the flat-plate stretchable device 51 is mounted to the hemisphere surface has been considered here as an extreme example, but in an actual case, even a stretchable device 51 having elongation of about 10% is considered to have a very wide usage range.

As described above, in the stretchable device 51 of this embodiment, the substrate 54 includes the high stretchability material 55 and the high rigidity material 56 higher in rigidity than the high stretchability material 55, and various electric elements 63 are mounted only on the high rigidity material 56.

In this case, when the stretchable device 51 is deformed, the electric element 63 mounted on the high rigidity material 56 is not deformed, but only the part of the high stretchability material 55 is stretched. Even when a crack 7 is generated in the metal wire layer 57 mounted on the high stretchability material 55, this crack 7 can be self-healed in the hybrid structure of the self-healing wires 1, 21, 31, and 41 corresponding to the healing portion. Therefore, even when the related-art electric element 63 without stretchability is used as it is, the part of each of the self-healing wires 1, 21, 31, and 41 has resistance to stretching and a healing function, and hence the resistance to stretching can be provided as the whole stretchable device 51.

In the seventh embodiment, an example of using the substrate 54 having a rigidity distribution has been described. In this case, a disconnected part being the crack 7 is generated in the highly deformed region. In this embodiment, such a phenomenon or other methods are used to control a generation region of the disconnected part. By controlling the region to be disconnected in this way, the disconnected part may be limited to one position or may be formed at a plurality of positions. By limiting the disconnected region to one position, the healing voltage can be reduced. On the other hand, by dispersing the disconnected regions to a plurality of positions, it is possible to prevent the disconnection interval from being excessively large, and to prevent long healing time or difficulty in healing.

Specifically, when the thickness or the width of a partial region of the wire (metal wire 3 or metal wire layer 57) is formed smaller than that of other regions, disconnection can be caused. Further, irregularities may be formed on the flexible substrate 2 or the high stretchability material 55 being a base layer such that a stress is liable to concentrate during pulling, to thereby more easily cause disconnection as compared to other regions. Further, the highly deformed region and the lowly deformed region described in the seventh embodiment may be formed in a plurality of pairs alternately, to thereby cause disconnection in a plurality of specific regions.

As described above, in this embodiment, at least one of the metal wire 3 and the metal wire layer 57, which correspond to the electric wire, or the flexible substrate 2 and the high stretchability material 55 is configured such that a crack 7 is generated at a predetermined portion in the metal wire 3 or the metal wire layer 57. With this, the generation region of the disconnected part being the crack 7 can be controlled.

Each embodiment of the present invention has been described. However, those embodiments are presented as examples and are not intended to limit the scope of the invention. Those embodiments may be implemented in other various modes, and various kinds of omissions, replacements, and modifications can be made without departing from the gist of the invention.

For example, as the metal particles (nanoparticles), silver, copper, and aluminum can be employed other than gold. Further, as described in Non Patent Literature 4, the metal wire may be formed into a zig-zag shape such that the existing electric wire having stretchability is used in combination with the self-healing function of the present invention. Thus, the self-healing wire and the stretchable device having both high conductivity and high stretchability according to one desired embodiment of the present invention can be obtained.

In addition, as the liquid 5, an insulating liquid, e.g., Fluorinert (trademark: produced by Sumitomo 3M Limited), or a non-volatile liquid, e.g., an ionic liquid may be used. Further, in order to prevent leakage of the liquid 5 even when the self-healing wires 1, 21, 31, and 41 are cut with a knife, the liquid 5 may be made of a gel material containing a liquid.

It is considered that, with a combination of the wire portion having stretchability and a micro-sensor element, the stretchable device 51 having stretchability as a whole can be achieved even without deformation of the sensor element portion. With this, applications to a sensor sheet, which can be bonded to a curved surface of a sphere or the like, or to a stretchable display can be expected.

Further, by achieving the object of the present invention, it is considered that a sticker-like or gel-sheet-like flexible sensor sheet or flexible display can be achieved as the stretchable device 51. The application of the property of high resistance to stretching is not limited to a case where the stretchability is necessary during usage, and for example, the property of high resistance to stretching is necessary for an application of bonding to a free curved surface. Therefore, industrial ripple effects are considered to be large.

As a specific example, as an industrial applicability of the stretchable device 51, there may be considered a flexible solar cell sheet that can be bonded even on a curved surface, a health monitoring sheet that is bonded to a biological object like an adhesive plaster or a gel sheet to measure or estimate a body temperature, a pulse wave (pulse), a blood oxygen saturation level, a blood sugar level, and the like, and a tactile sensor sheet that is bonded to a finger of a robot hand. Further, other than industrial applications, usage for academic phenomenon elucidation is conceivable, e.g., bonding a flow rate sensor on a swimsuit, a wing surface of an airplane, a surface of a baseball, and the like to measure a force from a fluid.

The invention claimed is:
1. A self-healing flexible electric device, comprising:
   a substrate having flexibility;
   an electric wiring arranged on the substrate;
   at least one fluid covering the electric wiring, the fluid being selected from the group consisting of a fluid having conductive particles dispersed therein and a fluid having metal ions dissolved therein; and
   a sealing container having flexibility liquid-tightly attached on the substrate, the sealing container sealing the fluid therein, thereby forming a hybrid wiring structure including the electric wiring and the fluid on the substrate, wherein the electric wiring covered with the fluid functions as a part of the self-healing flexible electric device.

2. The self-healing flexible electric device according to claim 1, wherein the electric wiring comprises terminal portions configured to enable voltage application to the electric wiring, to thereby generate an electric field only in a part of a crack when the crack is generated in the electric wiring.

3. The self-healing flexible electric device according to claim 2, wherein the conductive particles and a solid metal deposited from the metal ions are melted by heat in a part of the crack earlier than the electric wiring.

4. The self-healing flexible electric device according to claim 2, wherein the conductive particles comprise metal particles.

5. The self-healing flexible electric device according to claim 2, wherein the substrate is stretchable.

6. The self-healing flexible electric device according to claim 2, wherein the electric wiring comprises a metal wiring.

7. The self-healing flexible electric device according to claim 2, wherein at least one of the electric wiring or the substrate is configured such that a crack is generated at a predetermined portion in the electric wiring.

8. The self-healing flexible electric device according to claim 2, wherein the fluid is the fluid having conductive particles dispersed therein.

9. The self-healing flexible electric device according to claim 2, wherein the fluid is the fluid having metal ions dissolved therein.

10. The self-healing flexible electric device according to claim 1, wherein the conductive particles and a metal deposited from the metal ions are melted by heat in a part of a crack generated in the electric wiring earlier than the electric wiring.

11. The self-healing flexible electric device according to claim 1, wherein the conductive particles comprise metal particles.

12. The self-healing flexible electric device according to claim 1, wherein the substrate is stretchable.

13. The self-healing flexible electric device according to claim 1, wherein the electric wiring comprises a metal wiring.

14. The self-healing flexible electric device according to claim 1, wherein at least one of the electric wiring or the substrate is configured such that a crack is generated at a predetermined portion in the electric wiring.

15. The self-healing flexible electric device according to claim 1, wherein the fluid is the fluid having conductive particles dispersed therein.

16. The self-healing flexible electric device according to claim 1, wherein the fluid is the fluid having metal ions dissolved therein.

17. The self-healing flexible electric device according to claim 15, wherein a surface of the electric wiring is charged to have the same polarity as surfaces of the conductive particles, and wherein a surface of the substrate, which is in contact with the fluid in a part of a crack generated in the electric wiring, is charged to have a polarity different from the polarity of the surfaces of the conductive particles.

18. The self-healing flexible electric device according to claim 16, wherein a solid metal is deposited from the metal ions by electroless plating only on a surface of the substrate, which is in contact with the fluid in a part of a crack generated in the electric wiring.

19. The self-healing flexible electric device according to claim 1, wherein the substrate has a first portion made of a flexible material and a second portion made of a material higher in rigidity than the flexible material;

the hybrid wiring structure formed on the first portion of the substrate; and an electric element mounted only on the second portion of the substrate.

\* \* \* \* \*